(12) United States Patent
Lai et al.

(10) Patent No.: US 10,763,393 B2
(45) Date of Patent: Sep. 1, 2020

(54) MICRO LIGHT EMITTING DIODE CHIP AND DISPLAY PANEL HAVING SEMICONDUCTOR EPITAXIAL STRUCTURE

(71) Applicant: PlayNitride Inc., Tainan (TW)

(72) Inventors: Yu-Hung Lai, Tainan (TW); Yu-Yun Lo, Tainan (TW); Tzu-Yang Lin, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 12 days.

(21) Appl. No.: 15/866,473

(22) Filed: Jan. 10, 2018

(65) Prior Publication Data
US 2018/0198020 A1 Jul. 12, 2018

(30) Foreign Application Priority Data
Jan. 10, 2017 (TW) .............................. 106100760 A

(51) Int. Cl.
*H01L 33/06* (2010.01)
*H01L 27/146* (2006.01)
(Continued)

(52) U.S. Cl.
CPC ............ *H01L 33/06* (2013.01); *C30B 25/183* (2013.01); *C30B 29/406* (2013.01); *G09G 3/32* (2013.01);
(Continued)

(58) Field of Classification Search
CPC ... H01L 33/06; H01L 33/08; H01L 33/08382; H01L 33/382; G09G 3/32; G09G 3/3233;
(Continued)

(56) References Cited

U.S. PATENT DOCUMENTS 7,105,860 B2 * 9/2006 Shei ..................... H01L 25/167
257/355
7,589,350 B2 * 9/2009 Chen ..................... H01L 27/15
257/79

(Continued)

FOREIGN PATENT DOCUMENTS

CN 104183675 12/2014
JP 110229250 8/1998

(Continued)

OTHER PUBLICATIONS

"Office Action of China Counterpart Application," dated Sep. 4, 2019, p. 1-p. 6.

*Primary Examiner* — Khiem D Nguyen
(74) *Attorney, Agent, or Firm* — JCIPRNET

(57) ABSTRACT

A micro light emitting diode chip having a plurality of light-emitting regions, including a semiconductor epitaxial structure, a first electrode and a plurality of second electrodes disposed at interval is provided. The semiconductor epitaxial structure includes a first-type doped semiconductor layer, a plurality of second-type doped semiconductor layers and a plurality of light-emitting layers disposed at interval. The light-emitting layers are located between the first-type doped semiconductor layer and the second-type doped semiconductor layer. The light-emitting layers are located in the light-emitting regions respectively and electrically contact to the first-type doped semiconductor layer. The first electrode is electrically connected and contacts to the first-type doped semiconductor layers. The second electrodes are electrically connected to the second-type doped semiconductor layers. Furthermore, a display panel is also provided.

7 Claims, 22 Drawing Sheets

(51) Int. Cl.

| | | |
|---|---|---|
| *C30B 25/18* | (2006.01) | |
| *G09G 3/32* | (2016.01) | |
| *H01L 25/075* | (2006.01) | |
| *H01L 27/12* | (2006.01) | |
| *C30B 29/40* | (2006.01) | |
| *H01L 27/15* | (2006.01) | |
| *H01L 33/08* | (2010.01) | |
| *H01L 25/16* | (2006.01) | |
| *H01L 33/38* | (2010.01) | |

(52) U.S. Cl.
CPC ...... *H01L 25/0753* (2013.01); *H01L 27/1225* (2013.01); *H01L 27/1259* (2013.01); *H01L 27/14692* (2013.01); *H01L 27/153* (2013.01); *G09G 2300/0452* (2013.01); *H01L 25/167* (2013.01); *H01L 33/08* (2013.01); *H01L 33/382* (2013.01)

(58) Field of Classification Search
CPC ......... G02F 1/133603; G02F 2201/123; G02F 2202/108
See application file for complete search history.

(56) References Cited

U.S. PATENT DOCUMENTS

| 7,906,787 B2* | 3/2011 | Kang | H01L 33/08 |
| | | | 257/85 |
| 8,624,288 B2* | 1/2014 | Jang | H01L 33/0079 |
| | | | 257/98 |
| 2006/0157721 A1* | 7/2006 | Tran | H01L 33/0079 |
| | | | 257/98 |
| 2008/0083929 A1* | 4/2008 | Fan | H01L 27/15 |
| | | | 257/79 |
| 2010/0203661 A1* | 8/2010 | Hodota | H01L 33/0079 |
| | | | 438/29 |
| 2010/0308368 A1* | 12/2010 | Lee | H01C 7/006 |
| | | | 257/99 |
| 2011/0003410 A1* | 1/2011 | Tsay | H01L 33/0079 |
| | | | 438/27 |
| 2012/0007109 A1* | 1/2012 | Seo | H01L 27/156 |
| | | | 257/88 |
| 2013/0175553 A1* | 7/2013 | Hsieh | H01L 33/08 |
| | | | 257/88 |
| 2014/0197435 A1* | 7/2014 | Maute | H01L 33/42 |
| | | | 257/98 |
| 2014/0367705 A1* | 12/2014 | Bibl | H01L 33/44 |
| | | | 257/88 |
| 2015/0084054 A1* | 3/2015 | Fan | G02F 1/00 |
| | | | 257/72 |
| 2015/0187991 A1* | 7/2015 | McGroddy | H01L 27/016 |
| | | | 257/13 |
| 2016/0329376 A1* | 11/2016 | Kim | H01L 27/156 |
| 2017/0148771 A1* | 5/2017 | Cha | H01L 25/0753 |

FOREIGN PATENT DOCUMENTS

| JP | 2006190851 | 7/2006 | |
| KR | 100682255 | 2/2007 | |
| KR | 100682255 B1 * | 2/2007 | ............. H01L 33/02 |

* cited by examiner

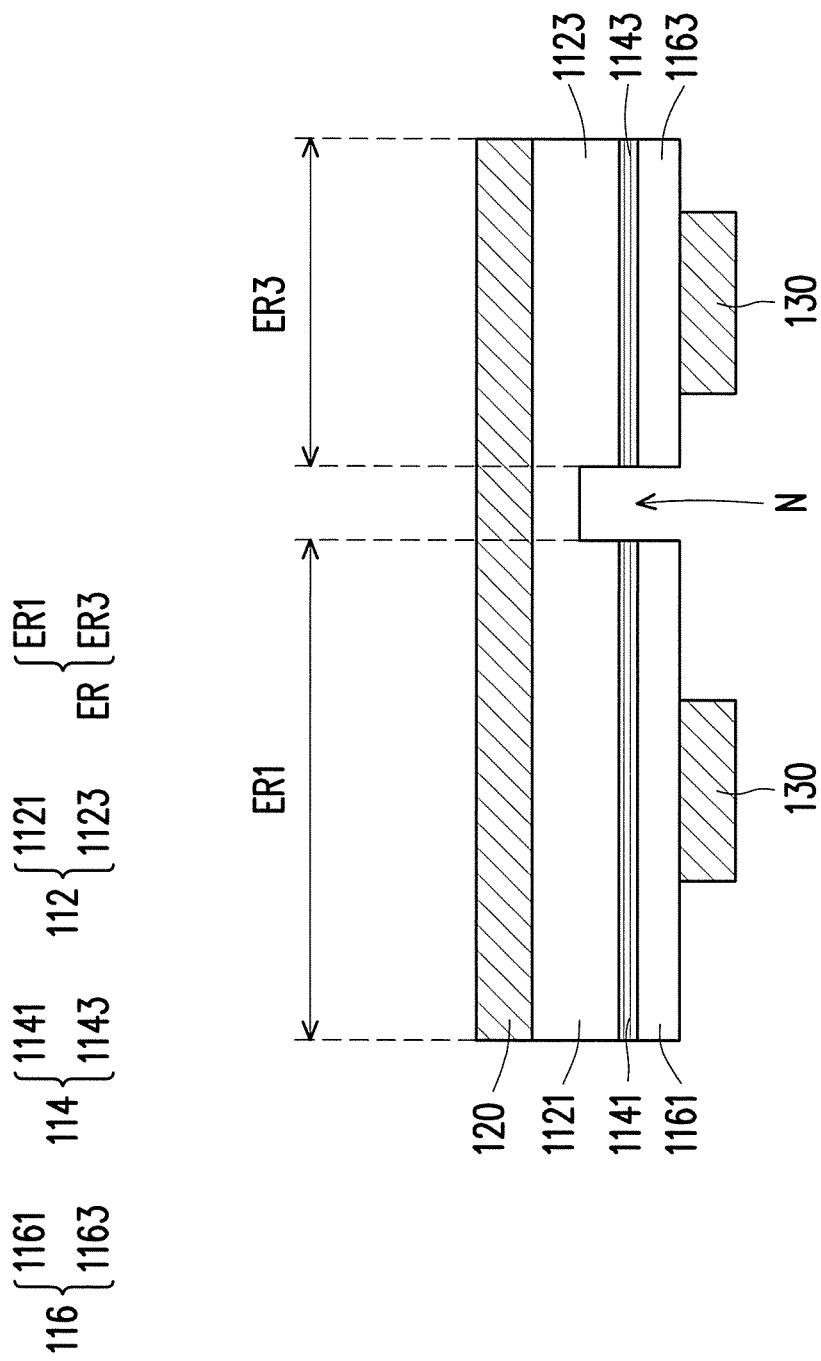

MICRO LIGHT EMITTING DIODE CHIP AND DISPLAY PANEL HAVING SEMICONDUCTOR EPITAXIAL STRUCTURE

CROSS-REFERENCE TO RELATED APPLICATION

This application claims the priority benefit of Taiwan application serial no. 106100760, filed on Jan. 10, 2017. The entirety of the above-mentioned patent application is hereby incorporated by reference herein and made a part of this specification.

BACKGROUND OF THE INVENTION

1. Field of the Invention

The present invention relates to a light emitting diode chip and display panel, and particularly relates to a micro light emitting diode (µLED) chip and a display panel having the micro light emitting diode chip.

2. Description of Related Art

The micro LED (µLED) has self-luminous display characteristics. Compared to the organic light emitting diode (OLED) technology which is also self-luminous display, the micro LED is high efficiency and has relatively long-life time. The material of the micro LED is not easily affected by the environment and stable. Therefore, the micro LED is expected to exceed the organic light-emitting diode display technology to become the main stream of the future display technology.

However, when the electrodes of the micro LED are bonded to the pads on the backplane of the display panel, it is not easy to align the electrodes of the micro LED to the pads on the backplane and lower the production yield of the display panel or deteriorate the image quality of the display panel. To solve the abovementioned problems, a plurality of bonding layers and a plurality of micro LEDs are disposed in each of the sub-pixel regions of the display panel in the conventional technology and a redundant repairing bond pads are reserved in each of the sub-pixel regions. If it is found that one of the micro LEDs in the sub-pixel region is defective product when the display panel is tested, for example, a micro LED in the sub-pixel region can't be lit up. At this moment, another micro LED is bonded on the reserved redundant repairing bond pad. However, such the solution method may make the sub-pixel region being overly large, the number of the sub-pixel regions is less, and the overall resolution of the display panel is then limited.

Based on the above, the solution to the problems abovementioned is one of the research focuses of the research personnel in the field.

SUMMARY OF THE INVENTION

The invention provides a micro light emitting diode chip, which can make the probability of the success bonding of the display panel applying the abovementioned micro light emitting diode chip high, and having excellent production yield and image quality.

The invention provides a display panel, which has excellent production yield and image property.

A micro light emitting diode chip is provided in an embodiment of the invention. The micro light emitting diode chip has a plurality of light-emitting regions. The micro light emitting diode chip includes a semiconductor epitaxial structure, a first electrode and a plurality of second electrodes. The semiconductor epitaxial structure includes a first-type doped semiconductor layer, a plurality of second-type doped semiconductor layers disposed at interval and a plurality of light-emitting layers disposed at interval. The light emitting layers are located between the first type doped semiconductor layer and the second type doped semiconductor layers. The light-emitting layers are located in the light-emitting regions respectively and electrically contact to the first-type doped semiconductor layer. The first electrode is electrically connected and contacted to the first-type doped semiconductor layer. The second electrodes are disposed at interval and electrically connected to the second-type doped semiconductor layers.

A display panel including a backplane and a plurality of micro light emitting diode chips abovementioned is provided in an embodiment of the invention. The backplane has a plurality of sub-pixel regions and a plurality of pads. The micro light emitting diode chips are located in the sub-pixel regions. The micro light emitting diode chips are electrically connected to the backplane through the pads and the backplane controls the micro light emitting diode chips to emit light in the corresponding sub-pixel regions.

In an embodiment of the invention, the semiconductor epitaxial structure has at least one trench separating the second-type doped semiconductor layers, separating the light-emitting layers and exposing the first-type doped semiconductor layer, and the light-emitting layers are independently controlled to emit light. The trench is extended from a side near the second-type doped semiconductor layer to the first-type doped semiconductor layer.

In an embodiment of the invention, the first electrode and the second electrodes are located at two opposite sides of the semiconductor epitaxial structure respectively.

In embodiment of the invention, the micro light emitting diode chip further comprises an insulation layer. The insulation layer has a plurality of through holes, wherein the first electrode has a main body portion and a plurality of extending portions extended from the main body portion. The insulation layer is located between the main body portion and the first-type doped semiconductor layers, and the extending portions are located in the through holes respectively and are connected to the first-type doped semiconductor layer.

In embodiment of the invention, the first electrode and the second electrodes are located at the same side of the semiconductor epitaxial structure.

In embodiment of the invention, the first electrode is electrically connected to the first-type doped semiconductor layer through the trench.

In embodiment of the invention, the micro light emitting diode chip has an insulation layer. The insulation layer is located between the first electrode, the light-emitting layers and the second-type doped semiconductor layers to be electrically isolated from the first electrode, the light-emitting layers, and the second-type doped semiconductor layers.

In embodiment of the invention, the semiconductor epitaxial structure has a plurality of trenches. The first electrode is electrically connected to the first-type doped semiconductor layer through one of the trench.

In embodiment of the invention, a range of a diagonal length of the micro light emitting diode chip falls in a range of 2 microns to 250 microns.

In embodiment of the invention, the semiconductor epitaxial structure has at least one trench. The at least one trench separates the second-type doped semiconductor layers and the light-emitting layers and exposes the first-type doped semiconductor layer. The light-emitting layers are connected to the first-type doped semiconductor layer and are independently controlled to emit light.

In embodiment of the invention, the first electrode and the second electrodes of each of the micro light emitting diode chips are located at two opposite sides of the semiconductor epitaxial structure. The second electrodes are located between the backplane and the semiconductor epitaxial structure, and the pads are electrically contacted to the second electrodes.

In embodiment of the invention, the number of the pads disposed in each of the sub-pixel regions is the same with the number of the second electrodes of each of the micro light emitting diode chips.

In embodiment of the invention, the first electrode and the second electrodes of each of the micro light emitting diode chips are located at two opposite sides of the semiconductor epitaxial structure respectively. The first electrode is located between the backplane and the semiconductor epitaxial structure and is electrically contacted to one of the pads.

In embodiment of the invention, the light-emitting layers of each micro light emitting diode chip are set in series via a conductive connecting layer.

A micro light emitting diode chip is provided in an embodiment of the invention. The micro light emitting diode chip has a plurality of light-emitting regions. The micro light emitting diode chip includes a semiconductor epitaxial structure, a first electrode and a plurality of second electrodes. The semiconductor epitaxial structure includes at least one first-type doped semiconductor layer, a plurality of second-type doped semiconductor layers and a plurality of light-emitting layers disposed in the light-emitting regions at interval. The light emitting layers are located between the first type doped semiconductor layer and the second type doped semiconductor layers. The light-emitting layers are electrically contacted to the first-type doped semiconductor layer. The first electrode is electrically connected and contacted to the first-type doped semiconductor layer. The second electrodes are disposed at interval and electrically connected to the second-type doped semiconductor layers. Areas of the light-emitting layers are different from each other and the light-emitting layers are independently controlled.

A display panel including a backplane and a plurality of micro light emitting diode chips is provided in an embodiment of the invention. The backplane has a plurality of sub-pixel regions. The micro light emitting diode chips are located in the sub-pixel regions. Each of the micro light emitting diode chips has a plurality of light-emitting regions and includes a semiconductor epitaxial structure, a first electrode and a second electrode. The semiconductor epitaxial structure includes a plurality of the sub-epitaxial structures, an insulating base layer and a conductive connecting layer. The sub-epitaxial structures are formed on the insulating base layer. Each of the sub-epitaxial structures has a first-type doped semiconductor layer, a light-emitting layer and a second-type doped semiconductor layer. The light-emitting layer is located in the light-emitting region and between the first-type doped semiconductor layer and the second-type doped semiconductor layer, and the light-emitting layers are set in series via the conductive connecting layer. The first electrode is electrically connected to the semiconductor epitaxial structure. The second electrode is electrically connected to the semiconductor epitaxial structure. The backplane is electrically connected to the micro light emitting diode chips and controls the micro light emitting diode chips to emit light.

In embodiment of the invention, at least a part of the micro light emitting diode chips is disposed in parallel in each of the sub-pixel regions.

Based on the above, each of the micro light emitting diode chips of the display panel of the embodiment in the invention has a plurality of second electrodes and a plurality of light-emitting layers disposed corresponding to the second electrodes. In each of the sub-pixel regions in the display panel, when the second electrodes of the micro light emitting diode chip are bonded to the backplane, as long as one of the second electrodes is bonded in success in the sub-pixel region, the backplane can control the light-emitting layers of the micro light emitting diode chip to emit light. In other words, when the micro light emitting diode chips are transferred to the backplane, the micro light emitting diode chip of the embodiment in the invention takes advantage of a larger electrode bonding area (such as the design of a plurality of second electrodes disposed at interval). Therefore, the micro light emitting diode chip of the embodiment in the invention can have less the defect pixels in the display panel using the abovementioned micro light emitting diode chip, so that the production yield and the image quality of the display panel are improved.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9B is a schematic cross-sectional view of the micro light emitting diode chip taken along a section line F-F' in FIG. 9A.

DESCRIPTION OF THE EMBODIMENTS

Figure 1A:
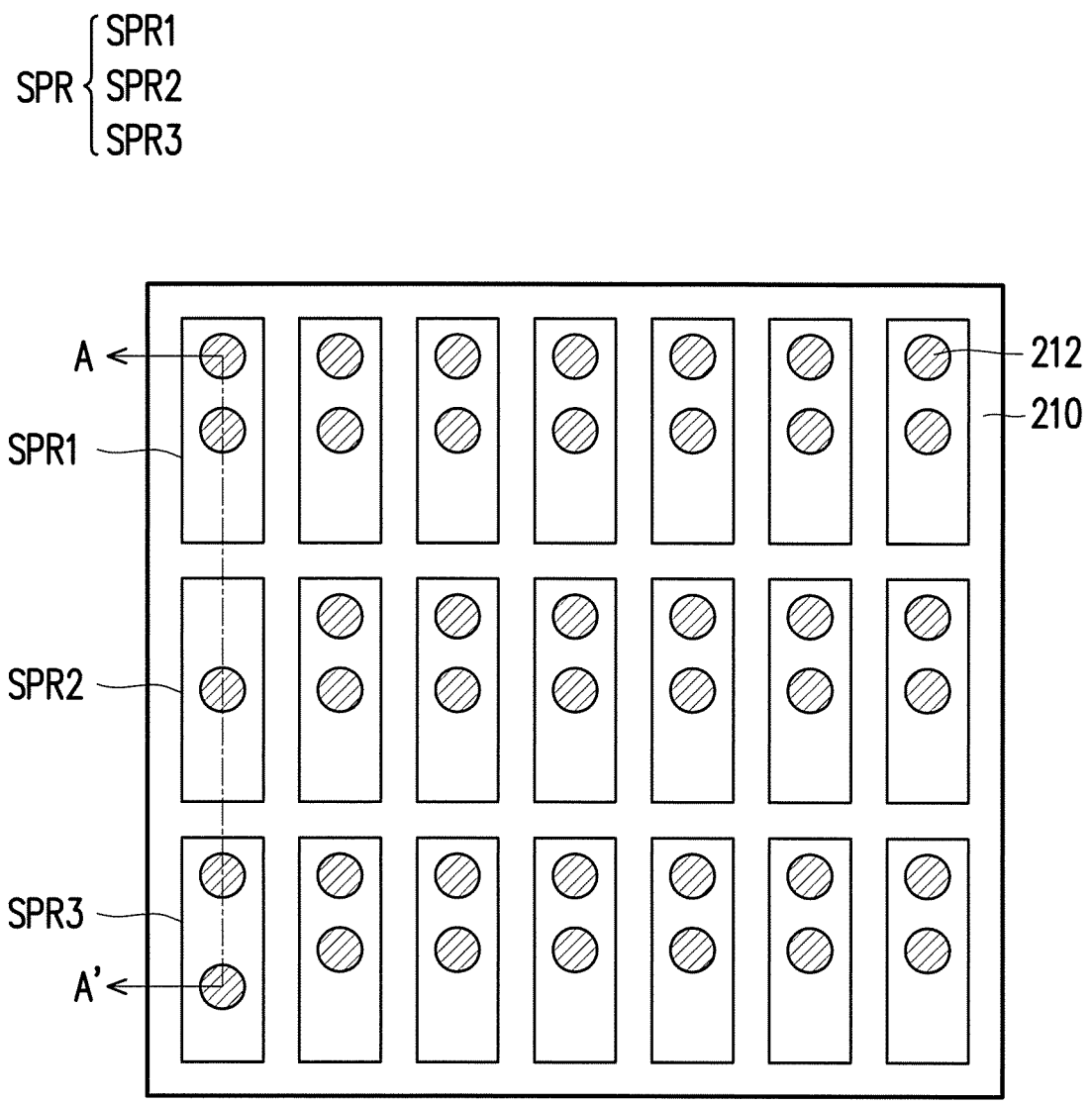
FIG. 1A is a schematic top view of the display panel according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
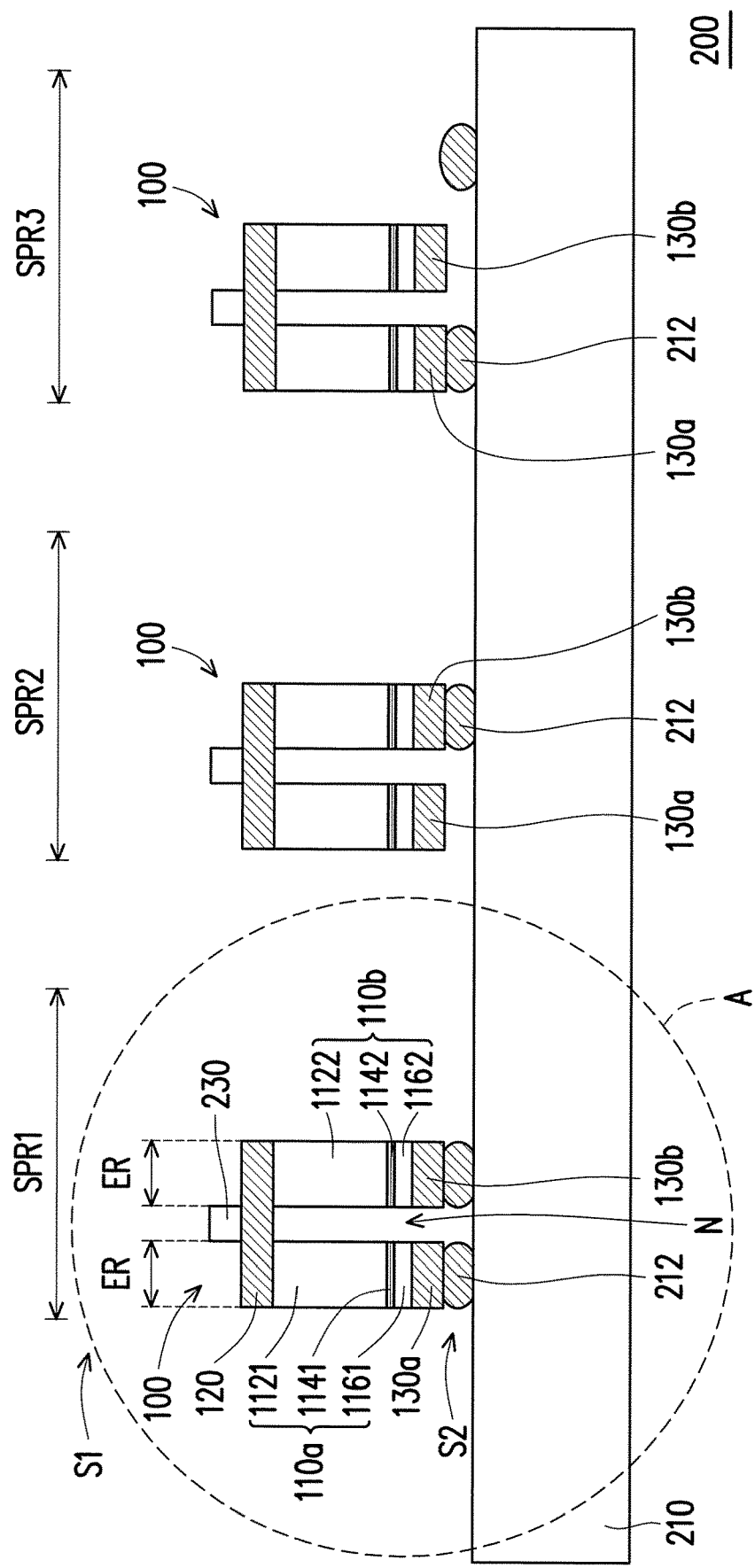
FIG. 1B is a schematic cross-sectional view taken along a section line A-A' in FIG. 1A.
Figure 1C:
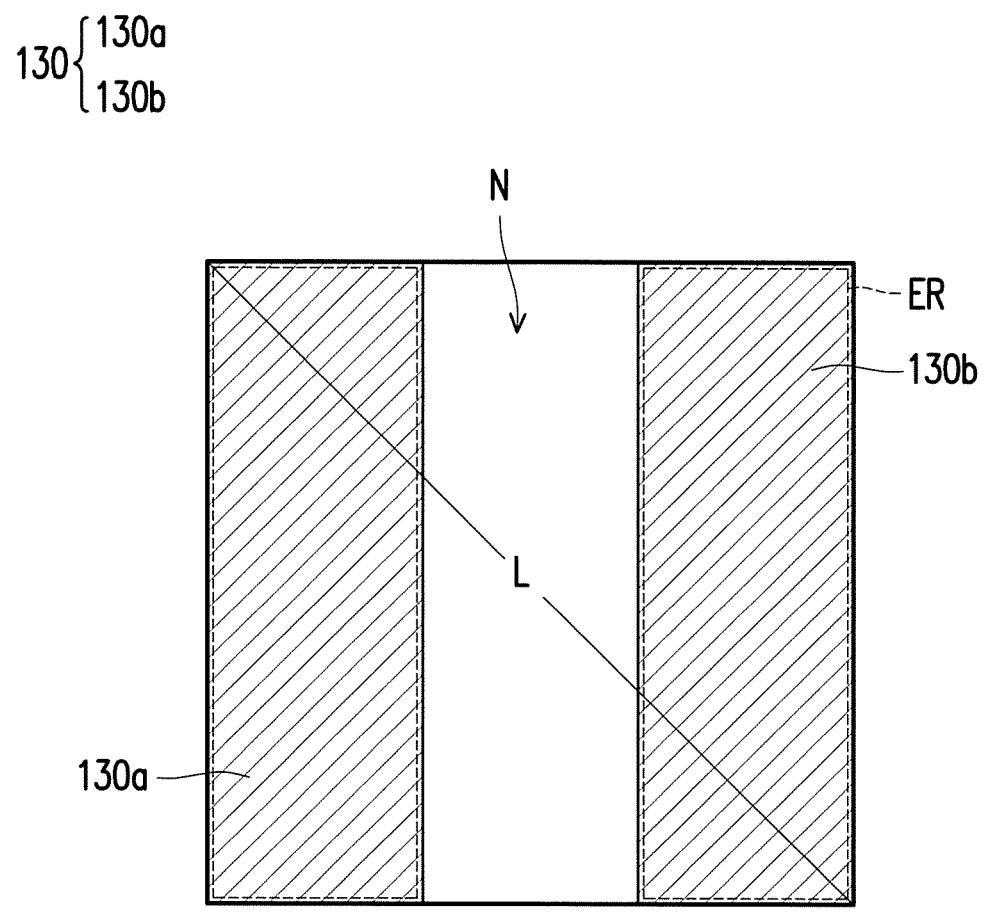
FIG. 1C is a bottom view of the micro light emitting diode chip of the display panel in FIG. 1A.
Figure 1D:
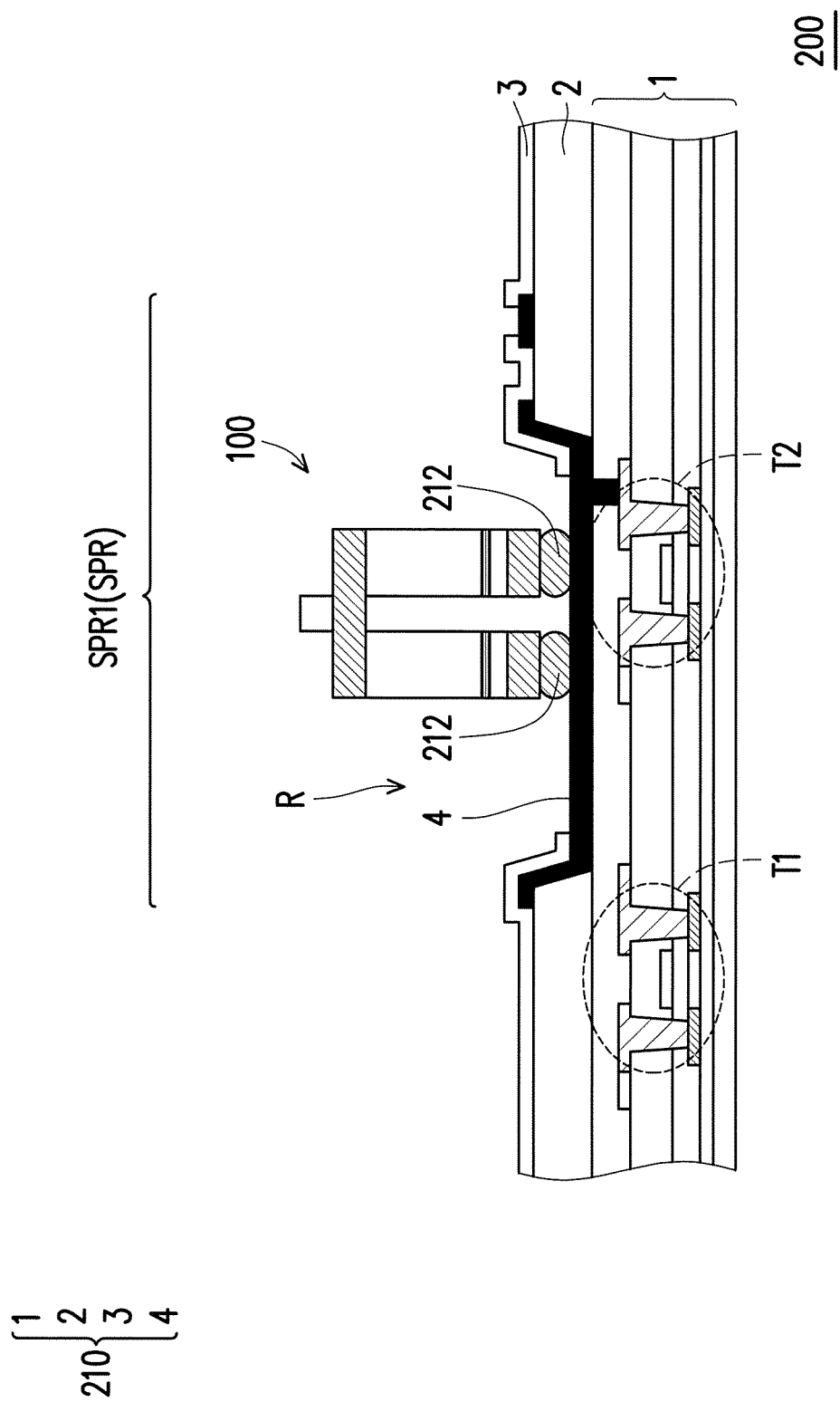
FIG. 1D is an enlargement view illustrating a region A in FIG. 1A.

FIG. 1A is a schematic top view of the display panel according to an embodiment of the invention. FIG. 1B is a schematic cross-sectional view taken along a section line A-A' in FIG. 1A. FIG. 1C is a bottom view of the micro light emitting diode chip of the display panel in FIG. 1A. It should be noted that, for the clear illustration, the micro light emitting diode chip and other layer structures are omitted in FIG. 1A, only the bonding location of the sub-pixel region and the micro light emitting diode chip are illustrated in the FIG. 1A. FIG. 1D is an enlargement view illustrating the region A in FIG. 1A.

Referring to FIG. 1A and FIG. 1B, in the embodiment, the display panel 200 includes a backplane 210 and a plurality of micro light emitting diode chips 100. The backplane 210 has a plurality of sub-pixel regions SPR and a plurality of pads 212. The micro light emitting diode chip 100 is located in the sub-pixel region SPR. In FIG. 1B, the sub-pixel regions SPR crossed by the section line A-A' are, for example, three sub-pixel regions SPR1, SPR2, SPR3. In the other embodiments, it can also be the sub-pixel regions SPR with the number less than three or the sub-pixel regions SPR with the number greater than three, the invention is not limited thereto. The backplane 210 further includes a plurality of sub-pixel driving circuit (not shown), the backplane 210 can also be a semiconductor substrate, a submount, a complementary metal-oxide-semiconductor (CMOS) circuit substrate, a liquid crystal on silicon (LCOS) substrate, a thin film transistor (TFT) substrate or a substrate of other types. The pads 212 are electrically connected to the sub-pixel driving circuit (not shown). The backplane 210 is configured to control the micro light emitting diode chips 100 in the sub-pixel regions SPR emitting light, so as to display an image. In the embodiment, the display panel 200 is substantially a micro LED display panel. The backplane 210 is substantially a thin film transistor substrate. The micro light emitting diode chips 100 are electrically connected to the backplane 210, more specifically, the micro light emitting diode chips 100 are electrically connected to the backplane 210 through the pads 212. The backplane 210 controls the micro light emitting diode chips 100 to emit light. To be more specific, referring to FIG. 1D, the backplane 210 further includes a TFT substrate 1, a patterned bank layer 2, an insulating layer 3 and a bonding layer 4. The TFT substrate 1 includes a LED driving circuit. The LED driving circuit, for example, includes a transistor T1 and a transistor T2. The patterned bank layer 2 is disposed on the TFT substrate 1, and has a recess R. The insulating layer 3 is disposed on the patterned bank layer 2 and exposes a portion of the bonding layer 4. The bonding layer 4 is electrically connected to the LED driving circuit and the micro light emitting diode chips 100, for example connect to the transistor T2. The LED driving circuit is electrically connected to the micro light emitting diode chips 100, and is configured to drive and/or switch the micro light emitting diode chips 100. People having ordinary skill in the art may have sufficient teaching, suggestion, and implementation illustration as to how to drive and implement the display panel 200, and thus no further details are provided hereinafter.

Referring to FIG. 1C, in the embodiment, the length of the diagonal L of each of the micro light emitting diode chips 100 is, for example, in micron-sized. More specifically, the length of the diagonal L of a micro light emitting diode chip 100 falls in the range of 2 microns to 250 microns, for example.

Referring to FIG. 1B and FIG. 1C, in the embodiment, the micro light emitting diode chip 100 has a plurality of light-emitting regions ER, for example, two light-emitting regions ER, but the invention is not limited thereto. The micro light emitting diode chip 100 includes a semiconductor epitaxial structure 110, a first electrode 120 and a plurality of second electrodes 130. The semiconductor epitaxial structure 110 includes at least one first-type doped semiconductor layer 112, a plurality of second-type doped semiconductor layers 116 disposed at interval and a plurality of light-emitting layers 114 disposed at interval. In the embodiment, two first-type doped semiconductor layers 1121, 1122, two light-emitting layers 1141, 1142 are provided, for example. The light emitting layers 114 are located between the first-type doped semiconductor layers 112 and the second-type doped semiconductor layers 116, and each the light-emitting layer 114 is located in the light-emitting region ER. The light-emitting layers 114 are independently controlled by the backplane 210 to emit light. The first electrode 120 is electrically connected and contacts to the first-type doped semiconductor layers 112. The second electrodes 130 are disposed at interval and electrically connected to the second-type doped semiconductor layers 116.

In detail, the micro light emitting diode chip 100 of the embodiment is, for example, a vertical type LED. The first electrode 120 and the second electrodes 130 of the micro light emitting diode chip 100 are located at two opposite sides S1, S2 of the semiconductor epitaxial structure 110 respectively. The first electrode 120 is located at the side S1. The second electrodes 130 are located at the other side S2 near the backplane 210, and the second electrodes 130 are located between the backplane 210 and the second-type doped semiconductor layers 116.

In the embodiment, the semiconductor epitaxial structure 110 includes two sub-epitaxial structures 110a, 110b separated from each other. The sub-epitaxial structures 110a, 110b are physically independent from each other. A trench N is provided between the sub-epitaxial structures 110a, 110b to electrically separate the sub-epitaxial structures 110a, 110b. Air, for example, is provided in the trench N. In the other embodiments, an insulating material can also be filled in the trench N, but the invention is not limited thereto. The sub-epitaxial structure 110a includes a first-type doped semiconductor layer 1121, a light-emitting layer 1141 and a second-type doped semiconductor layer 1161. The sub-epitaxial structure 110b includes a first-type doped semiconductor layer 1122, a light-emitting layer 1142 and a second-type doped semiconductor layer 1162. In the embodiment, the trench N is formed by an etching process, and is formed, for example, through an inductively-coupled plasma (ICP) process, but the invention is not limited thereto. The trench N is extended from the side S2 near second electrode 130 to the side S1 near the first electrode 120, so the first-type doped semiconductor layers 1121,1122 are physically independent to each other.

In the embodiment, normally, the number of the pads 212 disposed in each of the sub-pixel regions SPR is the same with the number of the second electrodes 130 of each of the micro light emitting diode chips 100 (the number of the pads 212 and the number of the second electrodes 130 are both two, for example, but the invention is not limited thereto). It should be noted that the disposition condition of the pads 212 illustrated by FIG. 1A is an example, the invention is not limited to the number of the pads 212 disposed in each of the sub-pixel regions SPR. Specifically, in the embodiment, two pads 212 are disposed in the sub-pixel region SPR1, and are connected to two second electrodes 130a, 130b of the micro light emitting diode chip 100 respectively. One pad 212 is shown in the sub-pixel region SPR2 to show that the pad 212 is not accurately disposed in the sub-pixel region SPR2. One of the pads 212 shown in the sub-pixel region SPR3 is slightly offset and misaligns the micro light emitting diode chip 100. More specifically, the display panel 200 further includes a plurality of conductive components 230, and the conductive component 230 is provided in the sub-pixel region SPR. The micro light emitting diode chips 100 can be independently controlled by the drive circuit layout (not shown) of the backplane 210 and determine whether the light-emitting layer 114 emit light or not. The material of the conductive component 230 is, for example, transparent conductive material (such as indium tin oxide), but the invention is not limited thereto.

Specifically, the forming method of the conductive components 230 is, for example, forming a transparent conductive layer on the micro light emitting diode chips 100 after the micro light emitting diode chips 100 are bonded with the pads 212 on the backplane 210. The forming method of the transparent conductive layer is, for example, a spin coating method or a vapor deposition method, but the invention is not limited thereto. Then, pattern the transparent conductive layer to form the conductive components 230, but the invention is not limited to the forming method of the conductive component 230.

In the embodiment, the backplane 210 provides the first type carrier (such as electron) through the conductive component 230, and provides the second type carrier (such as electron hole) to micro light emitting diode chip 100 through the pad 212 to make the light-emitting layers 114 emit light.

In the embodiment, the first-type doped semiconductor layer 112 is one of the P-type doped semiconductor layer and the N-type doped semiconductor layer. The second-type doped semiconductor layer 114 is the other one of the P-type doped semiconductor layer and the N-type doped semiconductor layer. More specifically, the first-type doped semiconductor layer 112 is, for example, the N-type doped semiconductor layer, the second-type doped semiconductor layer 114 is, for example, the P-type doped semiconductor layer, the invention is not limited thereto. The material of the N-type doped semiconductor layer is, for example, n-GaN. The material of the P-type doped semiconductor layer is, for example, p-GaN, but the invention is not limited thereto. The first type carrier provided by the backplane 210 is, for example, electron, the second type carrier provided by the backplane 210 is, for example, electron hole, the invention is not limited thereto.

More specifically, in each of the sub-pixel regions SPR, the first type carrier from the backplane 210 sequentially passes through the conductive component 230, the first electrode 120, the first-type doped semiconductor layer 112 and is transmitted to the light-emitting layer 114. The second type carrier from the backplane 210 sequentially passes through the pad 212, the second electrode 130, the second-type doped semiconductor layer 116 and is transmitted to the light-emitting layer 114. In such a way, the first type carrier and the second type carrier are recombined in the emitting layer 114 to emit light. Because the micro light emitting diode chip 100 of the embodiment has a plurality of second electrodes 130 disposed at interval, the process yield when the micro light emitting diode chips 100 are transferred and bonded on the pads 212 on the backplane 210 will be improved. In other words, at least one of the second electrodes (130a or 130b) of one micro light emitting diode chip 100 is well bonded to the pad 212 on the backplane 210, the light-emitting layer 114 can emit light correspondingly.

Furthermore, if the light emitted by one of the light-emitting layer 114 (e.g. 1141) is not bright enough, and then another light-emitting layer 114 (e.g. 1142) can be used for the brightness compensation.

In addition, it is worthy to mention that the backplane 210 can adjust the intensity of the light beam emitted by the light-emitting layer 1141 and the light-emitting layer 1142 respectively through the adjustment of the voltage or the current, but the invention is not limited thereto. That is, the success probability of bonding process is higher and it is unnecessary to proceed other chip transfer process to repair micro light emitting diode chip. Therefore, the micro light emitting diode chip 100 of the embodiment in the invention can improve transfer/bonding yield and the image quality of the display panel 200. Compared to the conventional technology, because there is no need to reserve two redundant bonding points of the packaging chips in each of the sub-pixel regions SPR of the display panel 200 in the embodiment of the invention, and therefore each of the sub-pixel regions SPR can have smaller area. Each of the unit areas of the display panel contains more sub-pixel regions SPR, so that the overall resolution of the display panel 200 can be increased.

In the embodiment, the material of the pads 212 is, for example, chosen from Indium (In), Stannum (Sn) or an alloy thereof (In/Sn), the invention is not limited thereto. The material of the first electrodes 120 and the second electrodes 130 is, for example, chosen from gold (Au), Sn or an alloy thereof (Au/Sn), the invention is not limited thereto. On the other hand, the structure of the emitting layers 114 is, for example, multiple quantum well (MQW). The multiple quantum well includes a plurality of wells and a plurality of barriers alternately disposed in a repetitive manner. Furthermore, the material of the emitting layers 114 includes, for example, alternately stacked multi-layer InGaN and multi-layer GaN. Through the design of the ratio of In or Gallium (Ga) in the emitting layer 114, the emitting layer 114 can emit light with different wavelength. It should be noted that the material of the emitting layers 114 listed above are for exemplary purpose only, the material of the emitting layer 114 are not limited to InGaN and GaN.

In addition, in the embodiment, the method of repairing the defect pixel is, for example, adjusting the working of the light-emitting regions ER through a drive circuit to repairing the defect pixel. Or, the layout design of the conductive components 230 and the first electrodes 120 in the following manufacturing process can be used to limit the circuit to enable the light-emitting region ER. These repairing methods can be achieved by various circuit layouts of the backplane 210, and are not limited by the embodiment.

It should be noted that the following embodiments use part of the content in the abovementioned embodiments, omit the descriptions of the same technical content, the same element can be referred to part of the content of the abovementioned embodiments, and are not repeated in the following embodiments.

Figure 2A:
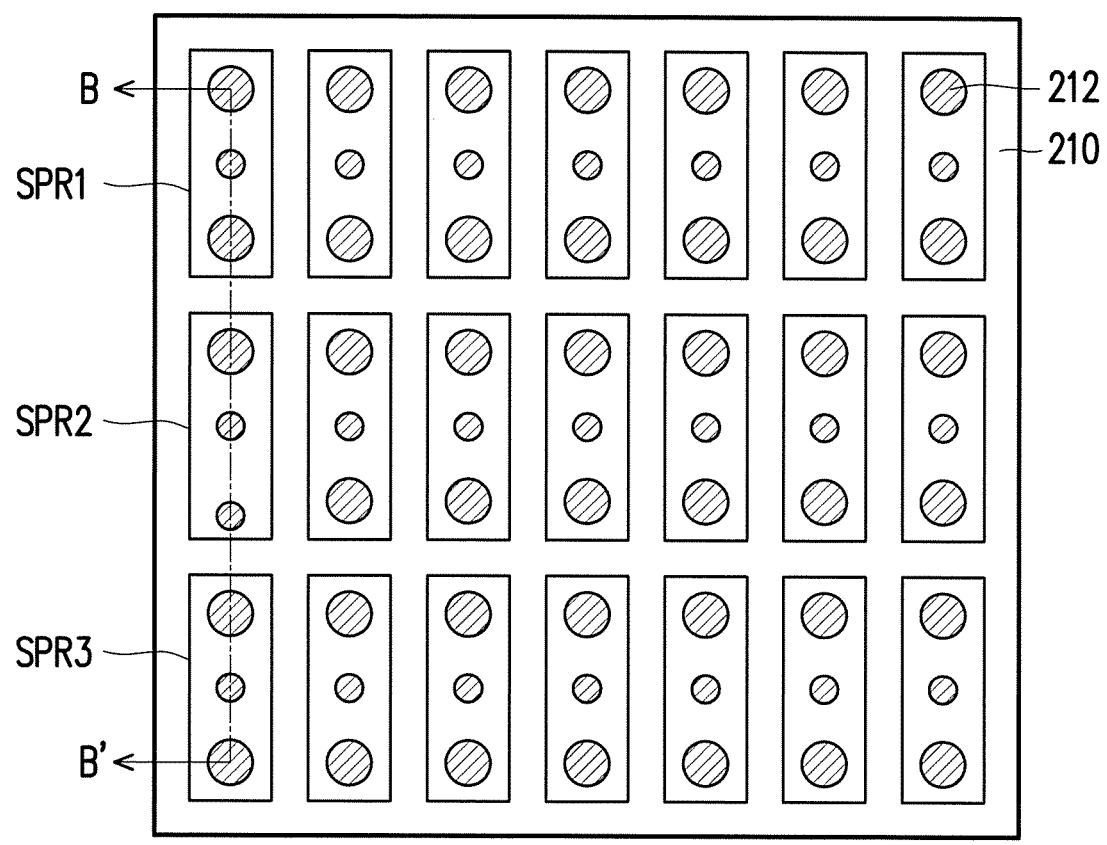
FIG. 2A is a schematic top view of the display panel according to another embodiment of the invention.
Figure 2B:
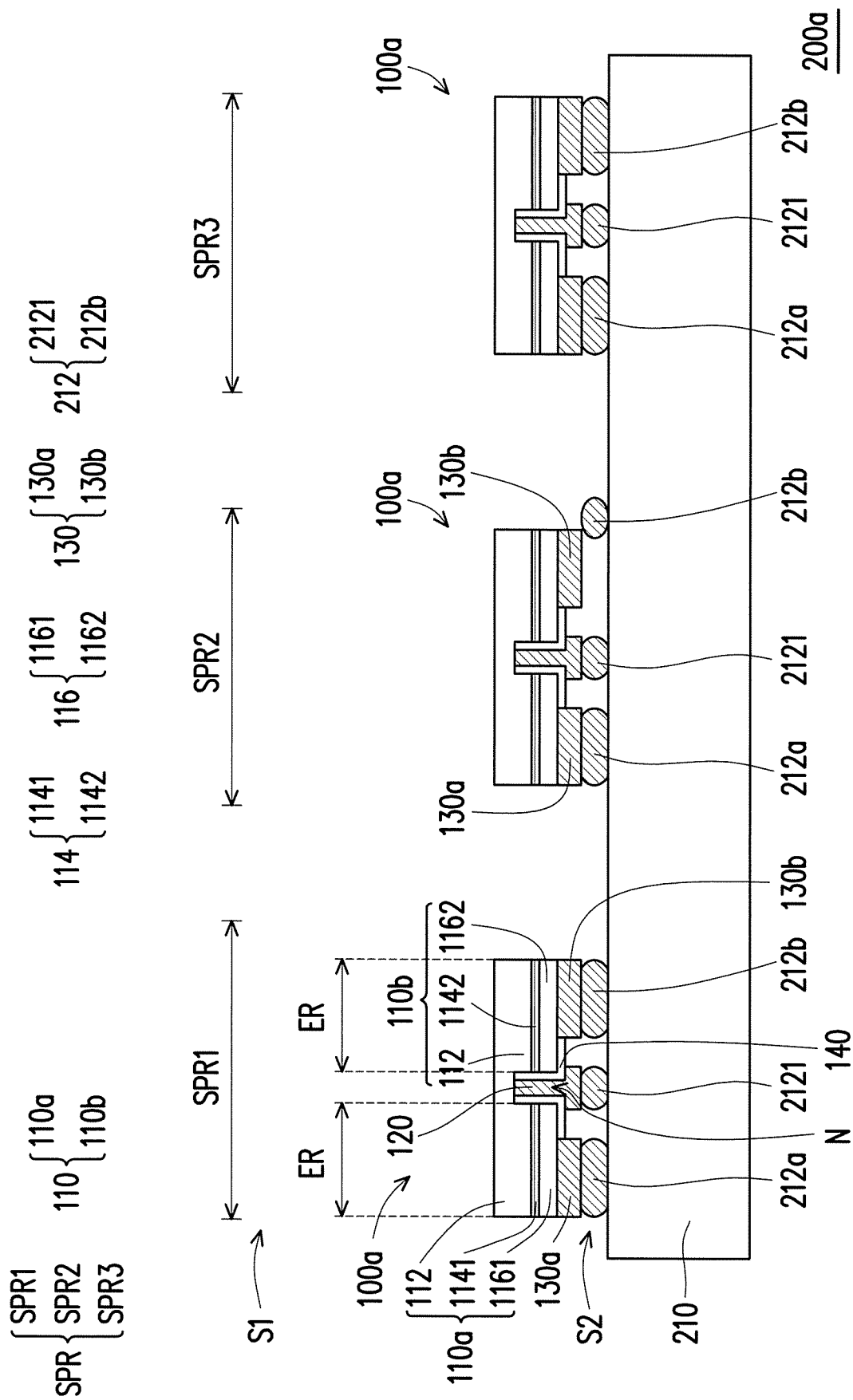
FIG. 2B is a schematic cross-sectional view taken along a section line B-B' in FIG. 2A.
Figure 2C:
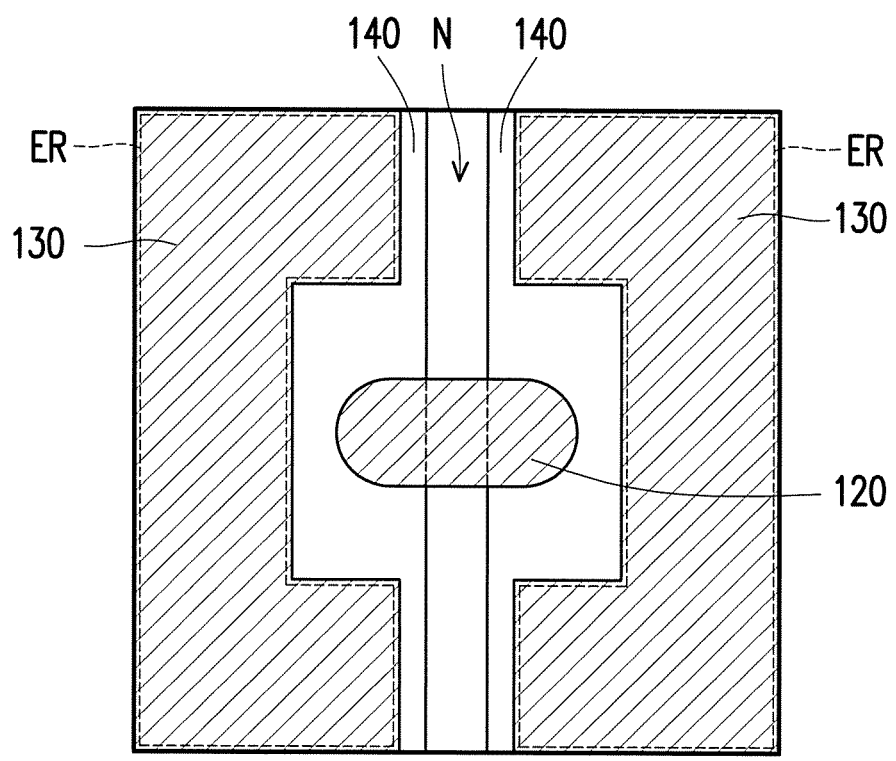
FIG. 2C is a bottom view of the micro light emitting diode chip in FIG. 2B.

FIG. 2A is a schematic top view of the display panel 200a according to another embodiment of the invention. FIG. 2B is a schematic cross-sectional view taken along a section line B-B' in FIG. 2A. FIG. 2C is a bottom view of the micro light emitting diode chip 100a in FIG. 2B. It should be noted that, for the clear illustration, the micro light emitting diode chip and other layer structures are omitted in FIG. 2A, only the bonding location of the sub-pixel region and the micro light emitting diode chip are illustrated in the FIG. 2A.

Referring to FIG. 2A to FIG. 2C, the display panel 200a of the embodiment is approximately like the display panel 200 in FIG. 1A and FIG. 1B, the main difference lies in that: three pads 212a, 212b, 2121 are provided in each of the sub-pixel regions SPR, and the micro light emitting diode chip 100a of the embodiment is, for example, a horizontal structure. Furthermore, the number of the pads 212 disposed in each of the sub-pixel regions SPR is equal to the summation of the number of the first electrodes 120 and the number of the second electrodes 130. Specifically, the first electrode 120 and the second electrodes 130 are located at the same side S2 of the semiconductor epitaxial structure 110. The semiconductor epitaxial structure 110 has a trench N. The trench N separates the light-emitting layers 1141, 1142 and the second-type doped semiconductor layers 1161, 1162. The first electrode 120 is in the trench N and is electrically connected to the first-type doped semiconductor layer 112. In the embodiment, the trench N is formed by removing a part of the second-type doped semiconductor layer 116, a part of the light-emitting layer 114 and a part of the first-type doped semiconductor layer 112, so as to expose the first-type doped semiconductor layer 112. The trench N is extended from the side S2 near the second-type doped semiconductor layer 1161 to the first-type doped semiconductor layer 112. In addition, the micro light emitting diode chip 100a further includes a first insulation layer 140. The first insulation layer 140 is located between the first electrode 120 and the light-emitting layers 1141, 1142, and is located between the first electrode 120 and the second-type doped semiconductor layers 1161, 1162. So the side wall of the first electrode 120 is electrically the light-emitting layers 1141, 1142 and the second-type doped semiconductor layers 1161, 1162. More specifically, the first insulation layer 140 covers the sidewalls of the second-type doped semiconductor layers 116 and the sidewalls of the light-emitting layers 114 and exposes the first-type doped semiconductor layer 112.

Referring to FIG. 2B again, in the well bonded sub-pixel region SPR (e.g. SPR1), the second electrode 130a is electrically connected to the pad 212a, another second electrode 130b is electrically connected to the pad 212b, and the first electrode 120 is electrically connected to the pad 2121. The first type carrier from the backplane 210 sequentially passes through the pad 2121, the first electrode 120, the first-type doped semiconductor layer 112 and is transmitted to the light-emitting layer 1141, 1142. The second type carrier from the backplane 210 sequentially passes through the pads 212a, 212b, the second electrodes 130a, 130b, the second-type doped semiconductor layers 1161, 1162 and is transmitted to the light-emitting layers 1141, 1142. However, in the sub-pixel region SPR2, a second electrode 130b of the micro light emitting diode chip 100a is not electrically connected to the pad 212b effectively due to a location deviation, but it still may use the second electrode 130a to be electrical connected to the pad 212a. Therefore, the backplane 210 can still control the micro light emitting diode chip 100a in the sub-pixel region SPR2 well. In addition, the light-emitting region ER to be operated can be chosen through the drive circuit design or repairing process. In the embodiment, the method of repairing the defect pixels is achieved by, for example, the method such as breaking with laser in the following manufacturing process and bridging connection, but the invention is not limited thereto.

Figure 3A:
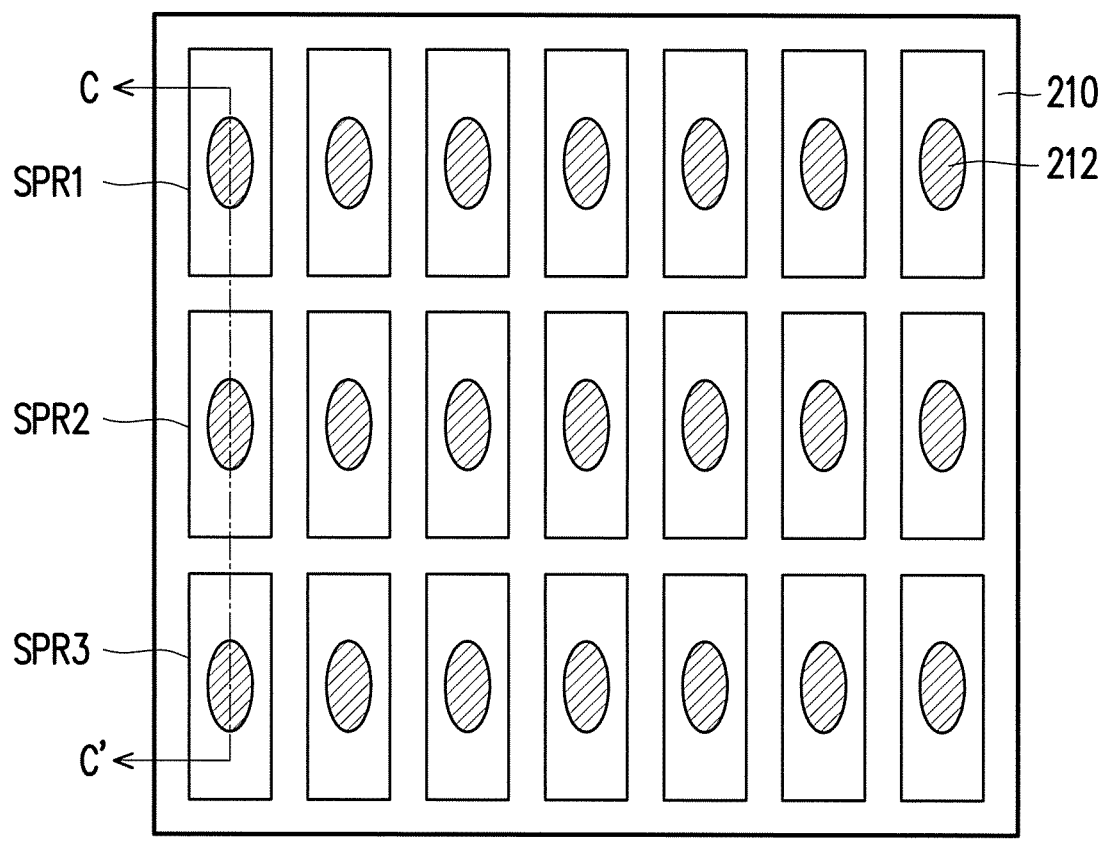
FIG. 3A is a schematic top view of the display panel according to another embodiment of the invention.
Figure 3B:
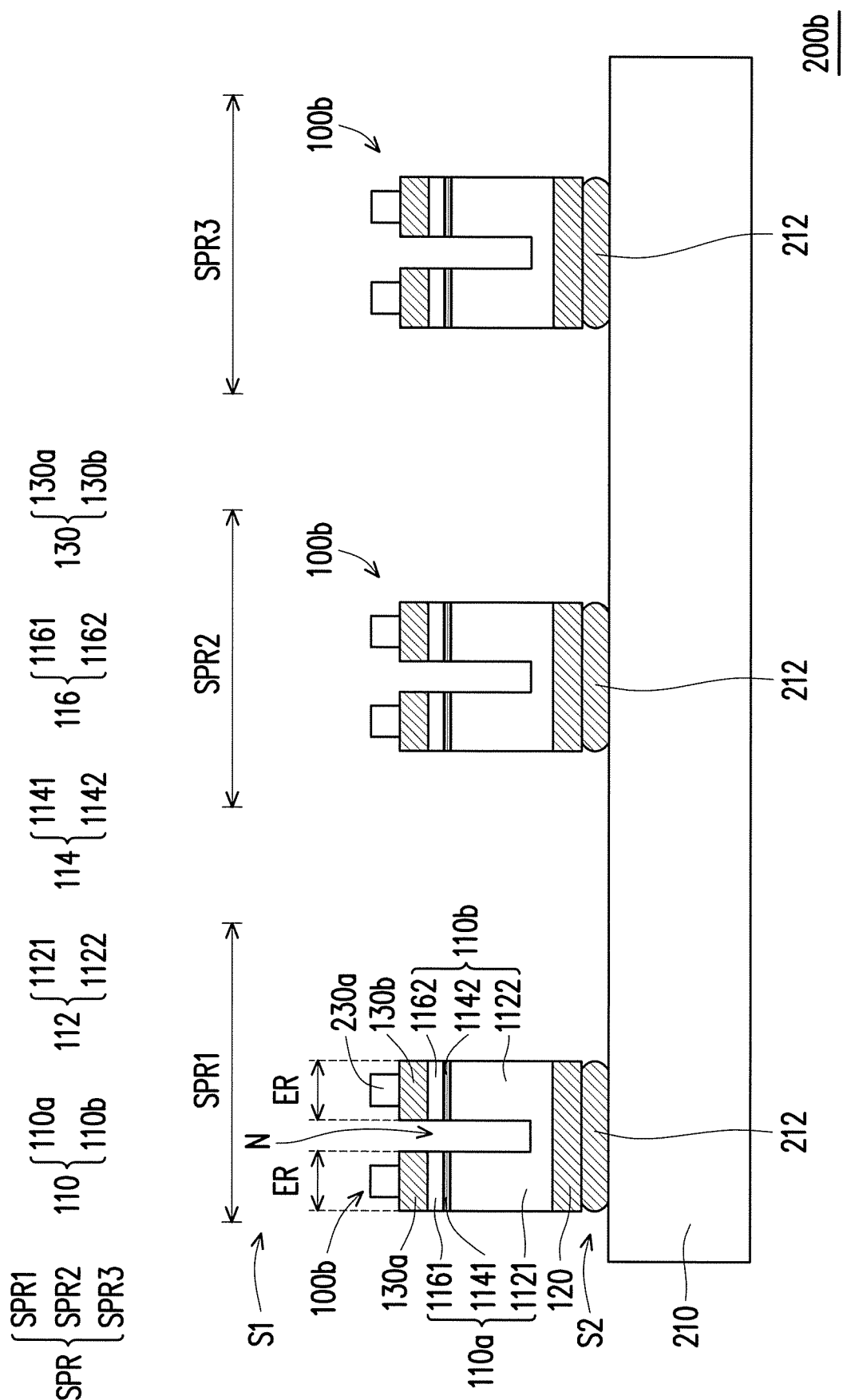
FIG. 3B is a schematic cross-sectional view taken along a section line C-C' in FIG. 3A.

FIG. 3A is a schematic top view of the display panel 200b according to another embodiment of the invention, FIG. 3B is a schematic cross-sectional view taken along a section line C-C' in FIG. 3A. It should be noted that, for the clear illustration, the micro light emitting diode chip and other layer structures are omitted in FIG. 3A, only the bonding location of the sub-pixel region and the micro light emitting diode chip are illustrated in FIG. 3A.

Referring to FIG. 3A to FIG. 3B, the display panel 200b of the embodiment is approximately similar to the display panel 200 in FIG. 1A and FIG. 1B, the main difference lies in that: the pads 212 being electrically connected to the first electrodes 120 and the first electrodes 120 are disposed between the semiconductor epitaxial structures 110 and the backplane 210. The micro light emitting diode chip 100b is electrically connected to the pad 212 with the side S2 where the first electrode 120 is located. Furthermore, the trench N of the micro light emitting diode chip 100b of the embodiment in the invention penetrates a part of the first-type doped semiconductor layer 112 to expose the first-type doped semiconductor layer 112. A plurality of conductive components 230a are disposed on the second electrodes 130a, 130b respectively, and are electrically connected to the second electrodes 130a, 130b. That is, the backplane 210 provides the second type carrier to the micro light emitting diode chip 100b through the conductive components 230a.

Based on the above, in the embodiment, the area of the first electrode 120 is substantially equal to the area of the epitaxial structure 110. That is, the first electrode 120 could have a larger area to bond the pad 212 of the backplane 210 and to improve the manufacturing yield during the bonding process. Take a step further, the display panel 200b may independently control the sub-epitaxial structures 110 by the conductive components 230a, so that the display quality and production yield of the display panel 200b are improved.

Figure 4:
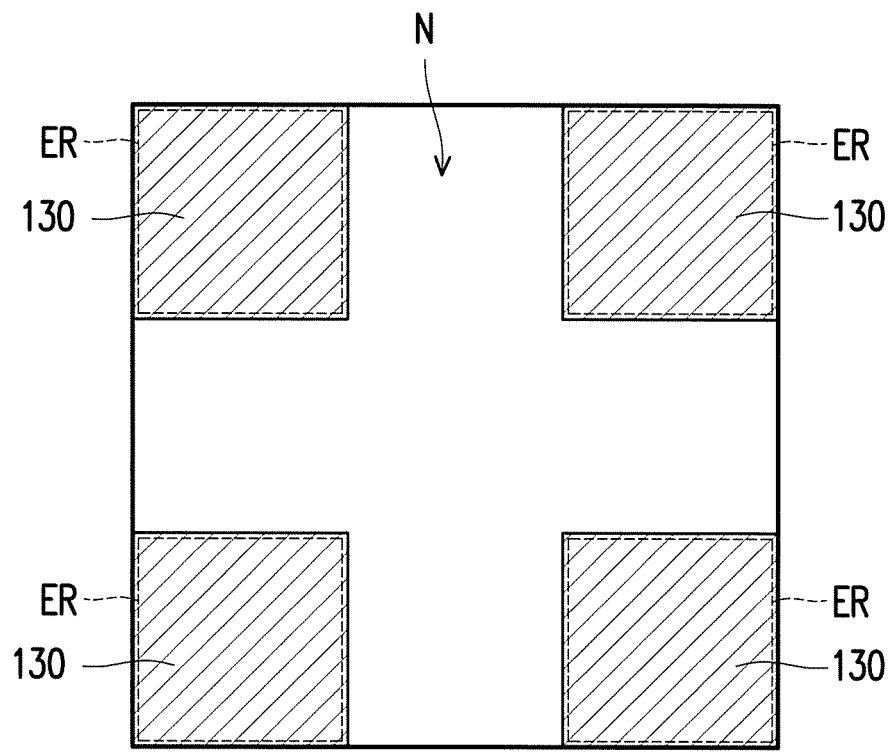
FIG. 4 is a schematic cross-sectional view of a micro light emitting diode chip according to another embodiment of the present invention.

Referring to FIG. 4, the micro light emitting diode chip 100c of another embodiment of the invention is illustrated, the micro light emitting diode chip 100c is approximately similar to the micro light emitting diode chip of FIG. 1B, or the micro light emitting diode chip 100b of FIG. 3B, the main difference lies in that: the micro light emitting diode chip 100c has four light-emitting regions ER. In other embodiments, the number of the light-emitting regions ER of the micro light emitting diode chip 100c can be, for example, three, the invention is not limited thereto.

Figure 5:
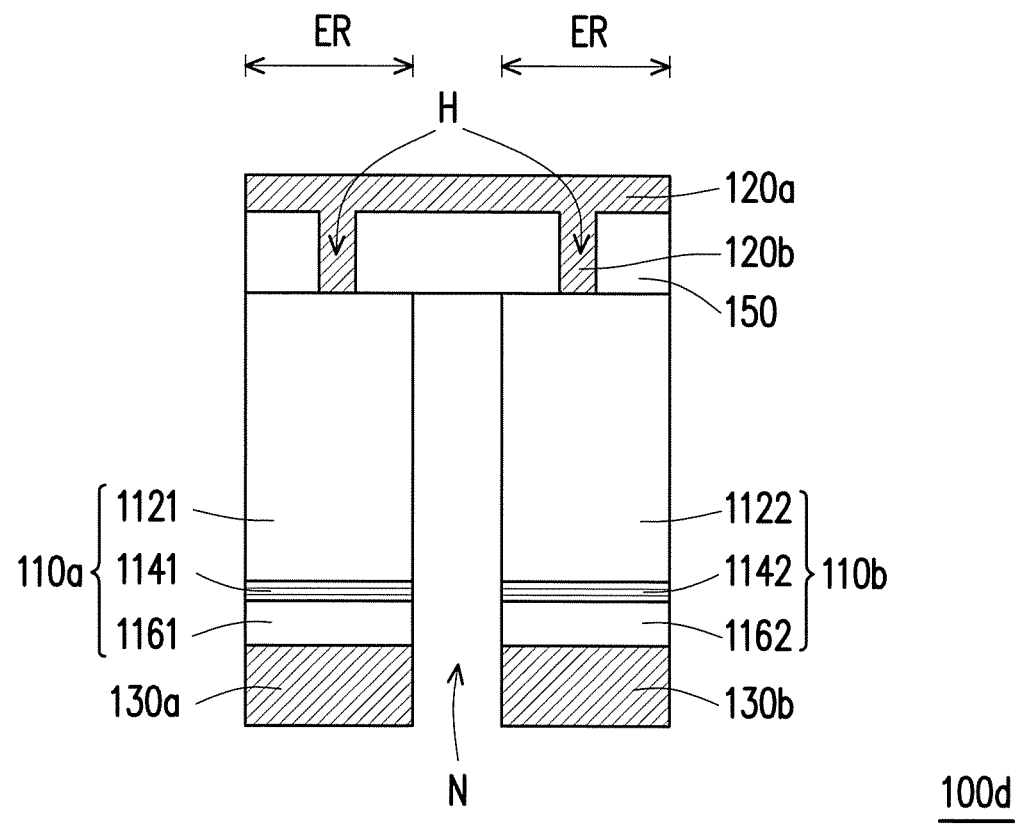
FIG. 5 is a schematic cross-sectional view of a micro light emitting diode chip according to another embodiment of the present invention.

Referring to FIG. 5, a micro light emitting diode chip 100d of another embodiment of the invention is illustrated, which can be used to replace the micro light emitting diode chip of the display panels 200, 200b of the abovementioned embodiments. The micro light emitting diode chip 100d is similar to the micro light emitting diode chip 100 in FIG. 1B, the main difference lies in that: the micro light emitting diode chip 100d further includes a second insulation layer 150. The second insulation layer 150 has a plurality of through holes H, for example, two through holes H, but the invention is not limited thereto. The through holes H penetrate the second insulation layer 150. The first electrode 120 has a main body portion 120a and a plurality of extending portions 120b extended from the main body portion 120a. The insulation layer 150 is located between the main body portion 120a and the first-type doped semiconductor layers 1121, 1122. The extending portions 120b of the first electrode 120 are located in the through holes H respectively, and the extending portions 120b are connected to the first-type doped semiconductor layers 1121, 1122 respectively. In the embodiment, the material of the insulation layer 150 is, for example, benzocyclobutene (BCB) or silicon dioxide ($SiO_2$), but the invention is not limited thereto.

Figure 6A:
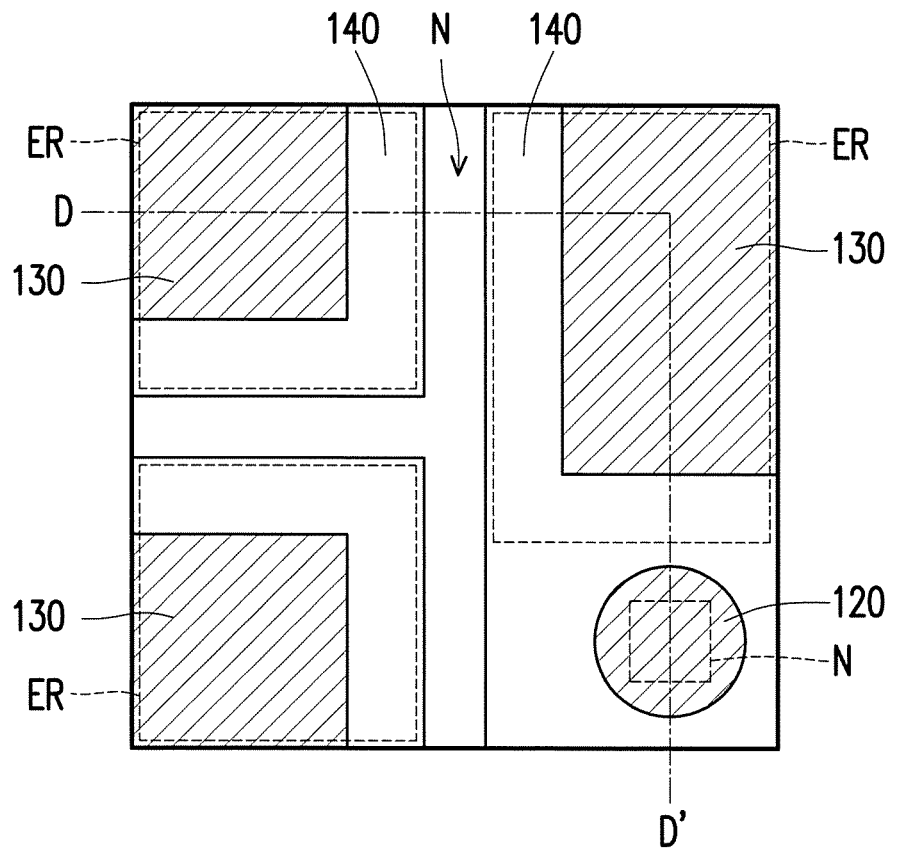
FIG. 6A is a bottom view of a micro light emitting diode chip according to another embodiment of the present invention.
Figure 6B:
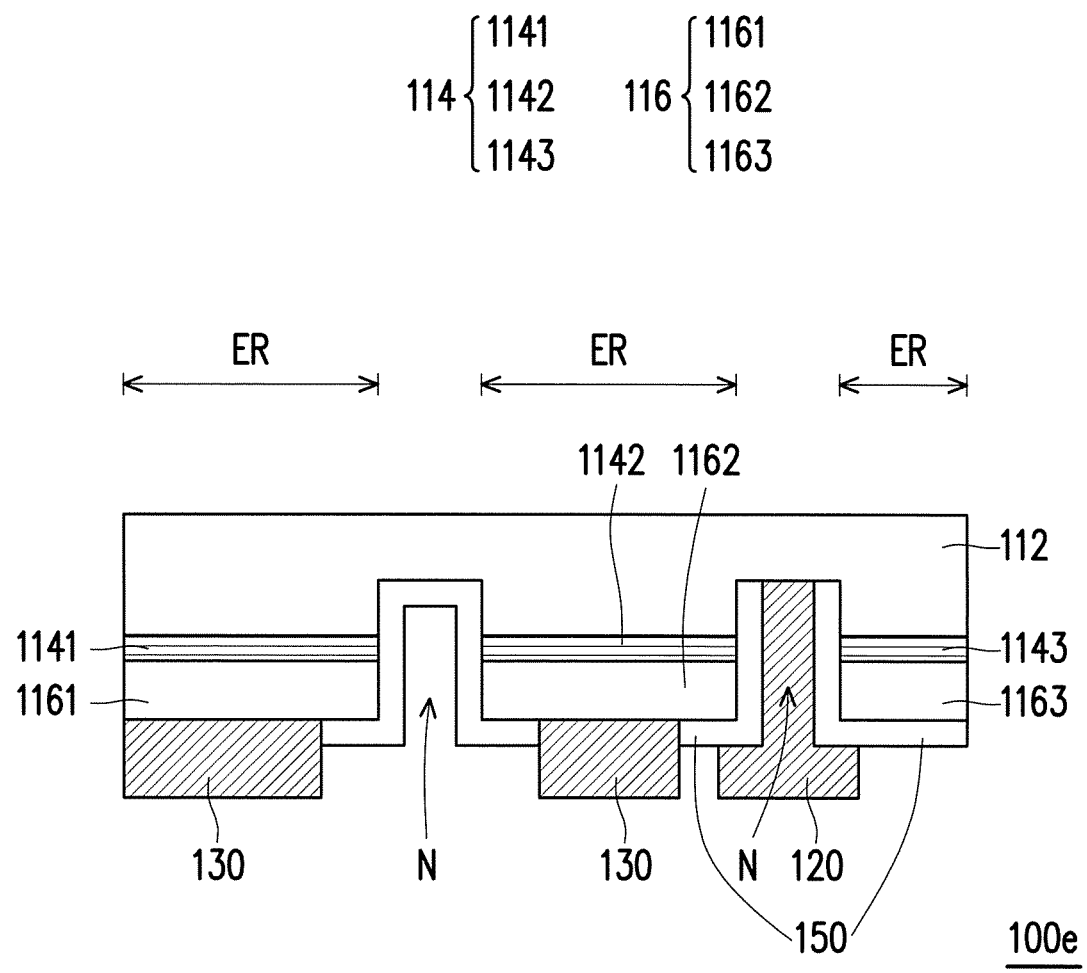
FIG. 6B is a schematic cross-sectional view of the micro light emitting diode chip taken along a section line D-D' in FIG. 6A.

FIG. 6A is a bottom view of a micro light emitting diode chip 100e according to another embodiment of the present invention. FIG. 6B is a schematic cross-sectional view of the micro light emitting diode chip taken along a section line D-D' in FIG. 6A.

Referring to FIG. 6A and FIG. 6B, the micro light emitting diode chip 100e of the embodiment is similar to the micro light emitting diode chip 100a of the FIG. 2A to FIG. 2C, the first electrode 120 and the plurality of second electrodes 130 are located at the same side, the main difference lies in: there is two trenches N and the arrangement method of the first electrode 120 and second electrodes 130. The first electrode 120 is in one of the trenches N to electrically connect the first-type doped semiconductor layers 112.

Figure 7:
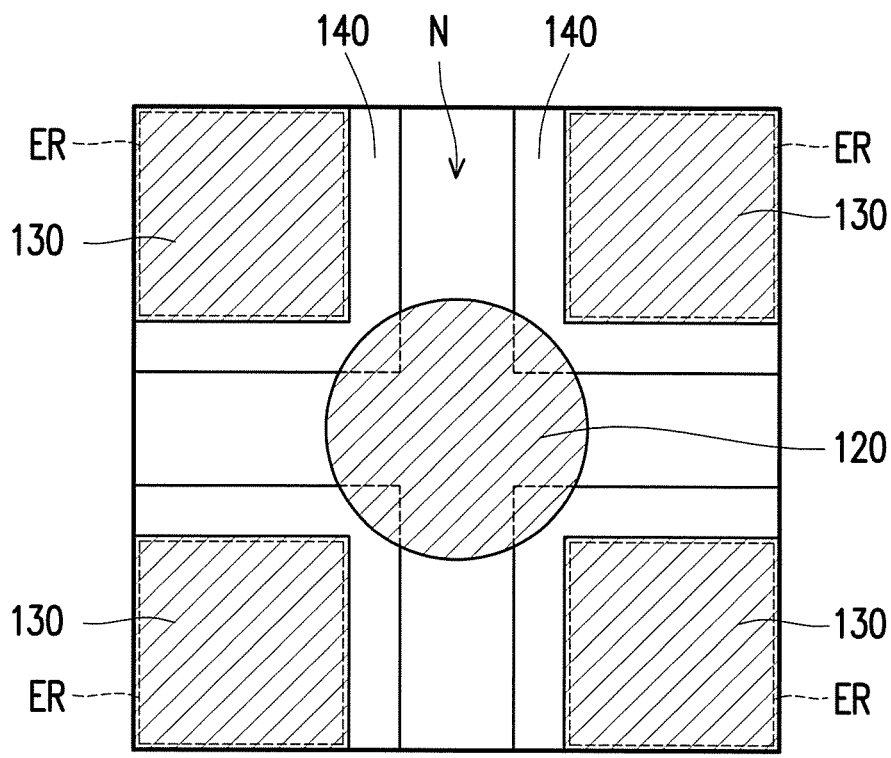
FIG. 7 is a cross-sectional view of a micro light emitting diode chip according to another embodiment of the present invention.

FIG. 7 is another micro light emitting diode chip 100f of the invention, similar to the micro light emitting diode chip 100e of FIG. 6A to FIG. 6B, the main difference lies in: the arrangement method of the first electrode 120 and the second electrodes 130.

Figure 8A:
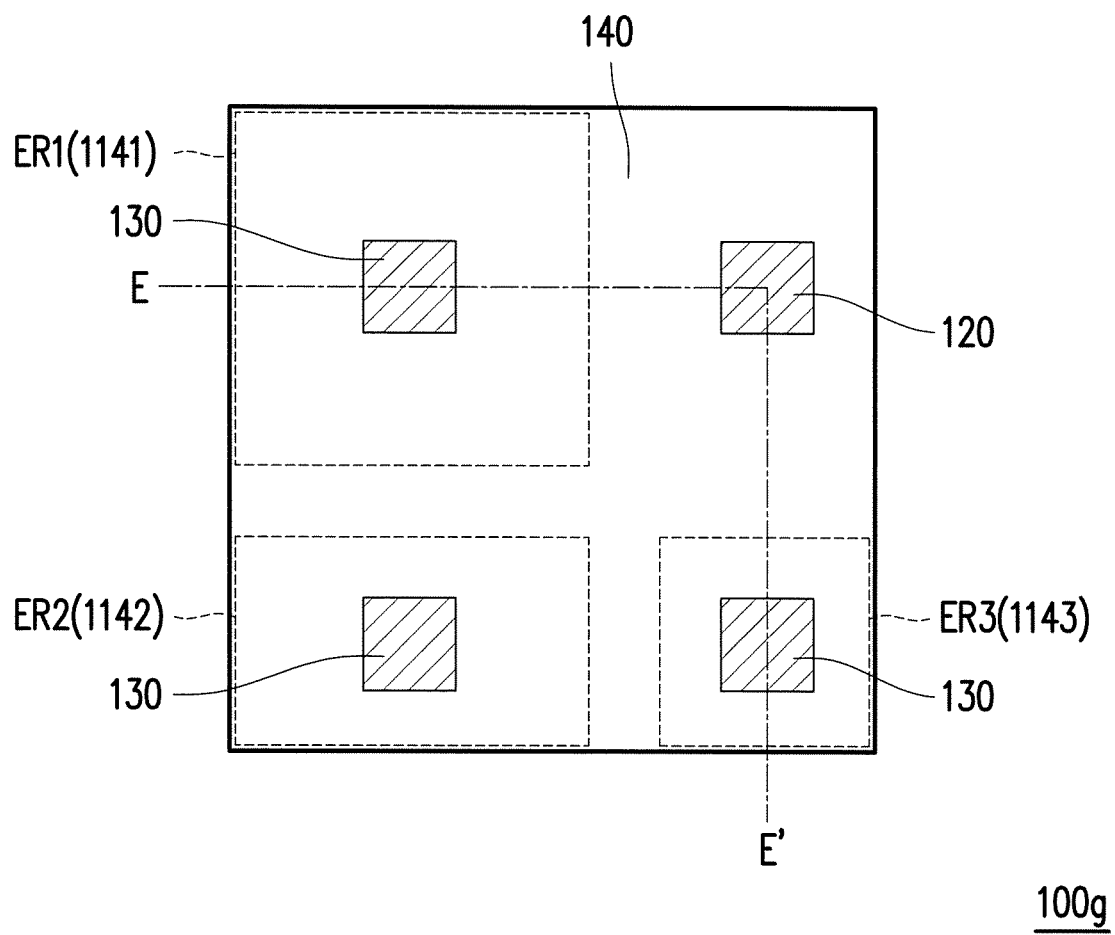
FIG. 8A is a bottom view of a micro light emitting diode chip according to an embodiment of the invention.
Figure 8B:
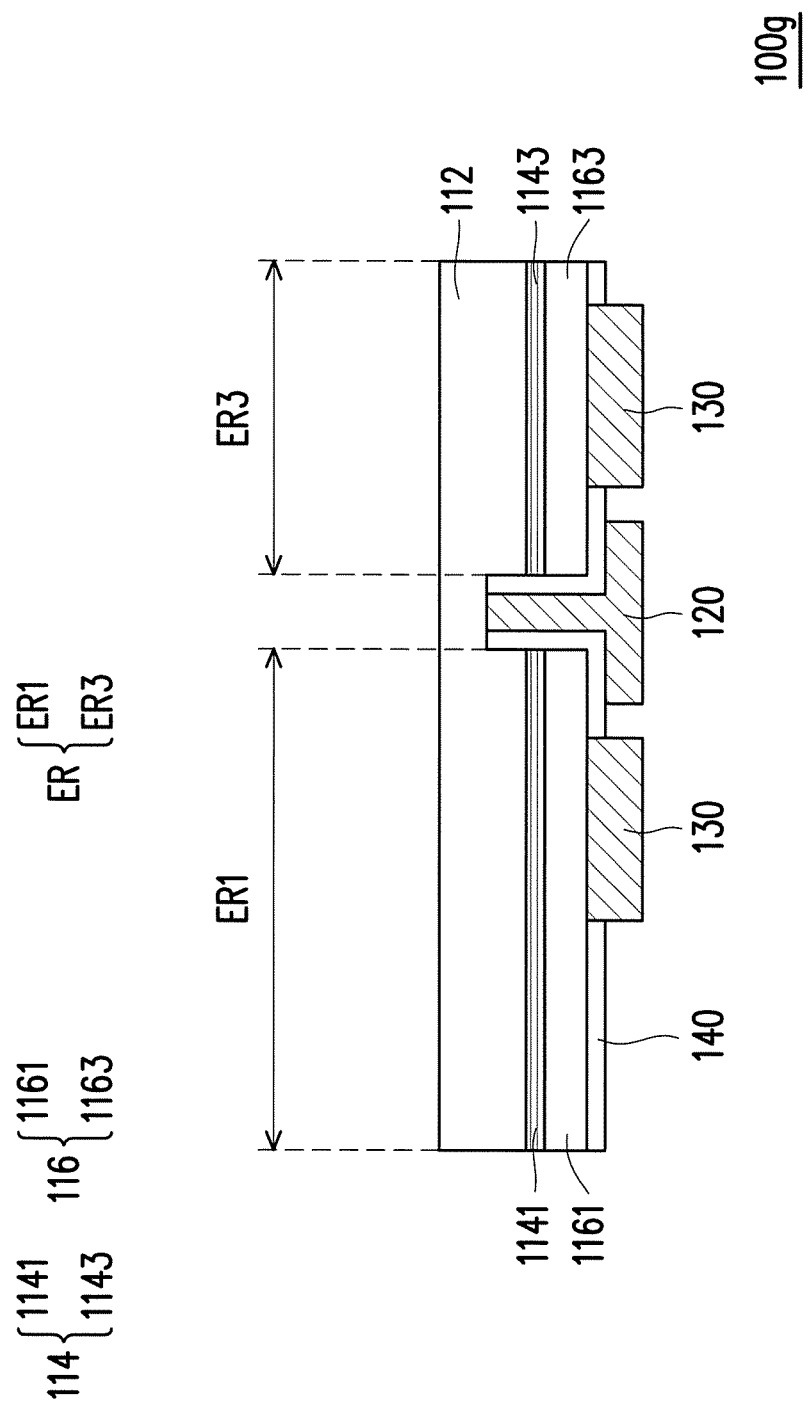
FIG. 8B is a schematic cross-sectional view of the micro light emitting diode chip taken along a section line E-E' in FIG. 8A.

FIG. 8A is a bottom view of a micro light emitting diode chip according to an embodiment of the invention. FIG. 8B is a schematic cross-sectional view of the micro light emitting diode chip taken along a section line E-E' in FIG. 8A.

Referring to FIG. 8A and FIG. 8B, the micro light emitting diode chip 100g is similar to the micro light emitting diode chip 100a in the FIG. 2B, while a difference is that the number of the light emitting layers 114 is, for example, three. Areas of the light-emitting layers 1141, 1142, 1143 are different to each other. To be more specific, in the embodiment, an area of the light-emitting layer 1141 is larger than an area of the light-emitting layer 1142, and the area of the light-emitting layer 1142 is larger than an area of the light-emitting layer 1143. When the micro light emitting diode chip 100g is controlled to emit light, the corresponding areas of the light-emitting region ER1~ER3 are different to each other and the light-emitting layers 1141, 1142, 1143 are controlled independently.

Figure 9A:
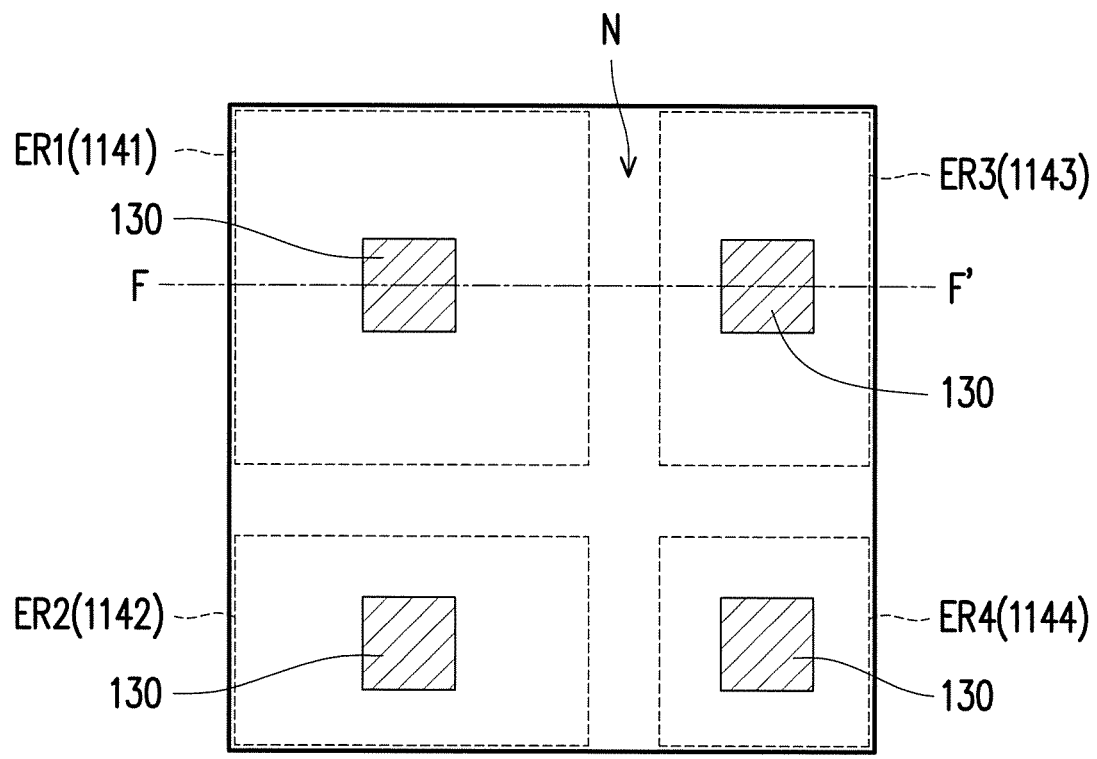
FIG. 9A is a bottom view of a micro light emitting diode chip according to an embodiment of the invention.

FIG. 9A is a bottom view of a micro light emitting diode chip according to an embodiment of the invention. FIG. 9B is a schematic cross-sectional view of the micro light emitting diode chip taken along a section line F-F' in FIG. 9A.

Referring to FIG. 9A and FIG. 9B, the micro light emitting diode chip 100h is similar to the micro light emitting diode chip 100 in the FIG. 1B, while a difference is that the number of the light emitting layers 114 is, for example, four. Areas of the light-emitting layers 1141~1144 are different to each other. When the light-emitting layers 1141~1144 are controlled to emit light, the corresponding areas of the light-emitting region ER1~ER4 are different to each other.

Through the abovementioned configuration, when the micro light emitting diode chip 100g or 100h is controlled to emit light, the light-emitting regions ER emit light independently and have different light-emitting areas to each other. That is to say, in a case of providing the same current I to each of the light-emitting layers 114 individually, each of the light-emitting regions ER respectively has different grey values. Take the micro light emitting diode 100h in FIG. 9A and FIG. 9B for an example, in a case of only providing a current I to the light-emitting layer 1141, only the light-emitting layer 1141 emits light and the grey value of the micro light emitting diode 100h is G1. In a case of only providing the current I to the light-emitting layer 1142, only the light-emitting layer 1142 emits light, and the grey value of the micro light emitting diode 100h is G2. In a case of providing the current I to the light-emitting layer 1141~1142 at the same time, the grey value of the micro light emitting diode 100h is G3. To take a step further, the micro light emitting diode chip 100h can achieve different grey values by providing current I to at least one of the light-emitting layers 1141~1144. For example, in a case of providing the same current I to the light-emitting layers 1141~1144 at the same time, the grey value of the micro light emitting diode chip 100h is G4. From another point of view, the micro light emitting diode chip 100h may achieve different grey values by providing current I to a combination set selected from the light-emitting layers 1141~1144 having different areas to each other.

For a conventional micro light emitting diode chip having a single light-emitting layer, it is required that providing different current to the single light-emitting layer for different grey values. Normally, the numbers of the grey value of the conventional micro light emitting diode chipare the same with the numbers of the providing current value.

Relatively speaking, the micro light emitting diodes 100g, 100h of the embodiment of the present invention can achieve different grey values by providing the same current to at least a part of the light-emitting layers 114 or providing different current to at least a part of the light-emitting layers 114. That's to say, compared to the conventional micro light emitting diode chip, the micro light emitting diodes 100g, 100h may achieve more grey values with less providing current values. Furthermore, the micro light emitting diodes 100g, 100h of the embodiments of the present invention can achieve a small grey value by providing a larger current to a light-emitting layer 114 having a small area to avoid blue shift phenomenon or color difference phenomenon.

Figure 10A:
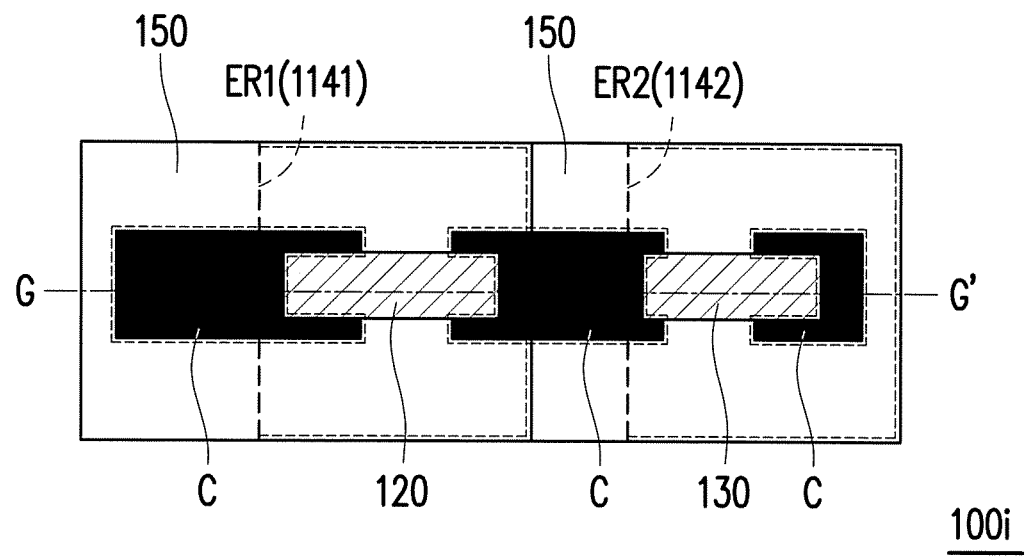
FIG. 10A is a top view of a micro light emitting diode chip according to an embodiment of the invention.
Figure 10B:
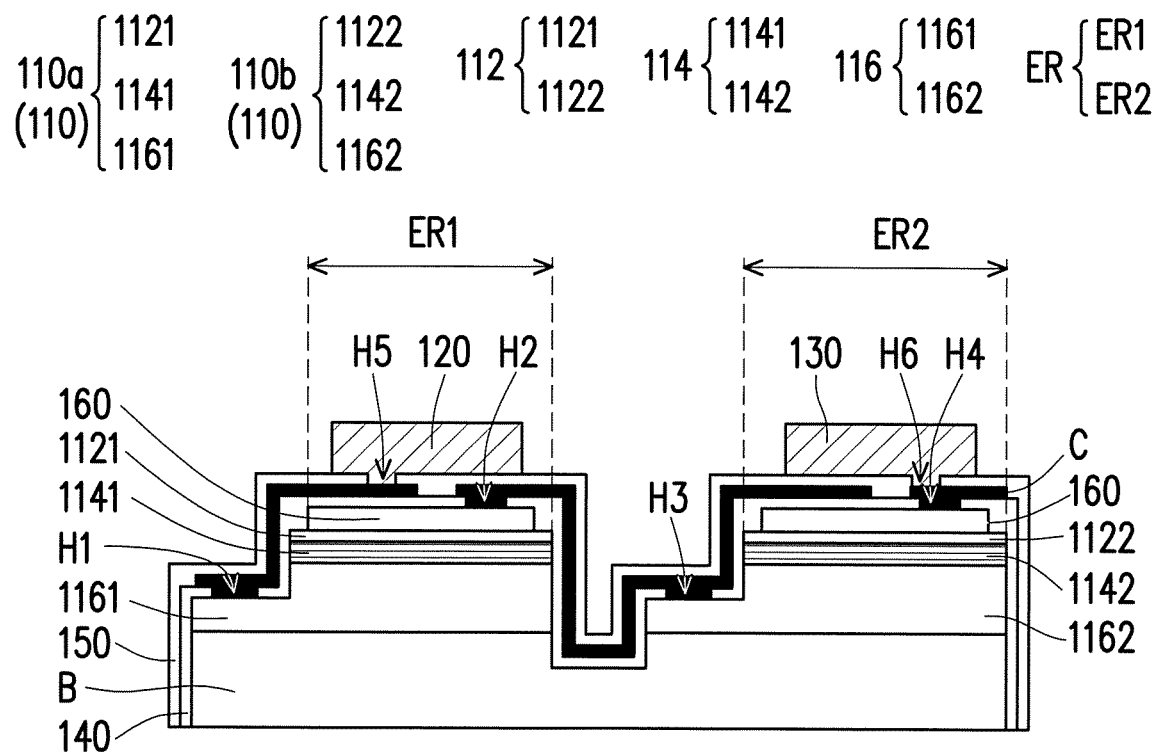
FIG. 10B is a schematic cross-sectional view of the micro light emitting diode chip taken along a section line G-G' in FIG. 10A.

FIG. 10A is a top view of a micro light emitting diode chip according to an embodiment of the invention. FIG. 10B is a schematic cross-sectional view of the micro light emitting diode chip taken along a section line G-G' in FIG. 10A.

Referring to FIG. 10A and FIG. 10B, the micro light emitting diode chip 100i has a plurality of light-emitting regions ER, for example, two light-emitting regions ER1, ER2. The micro light emitting diode chip 100i includes a semiconductor epitaxial structure 110, a first electrode 120, a second electrode 130 and a conductive connecting layer C. The semiconductor epitaxial structure 110 includes two semiconductor sub-epitaxial structures 110a, 110b and an insulating base layer B. The semiconductor sub-epitaxial structures 110a, 110b are formed on the insulating base layer B. Each of the semiconductor sub-epitaxial structures 110a, 110b includes a first-type doped semiconductor layer 112, a light-emitting layer 114 and a second-type doped semiconductor layer 116. The light-emitting layer 114 is located between the first-type doped semiconductor layer 112 and the second-type doped semiconductor layer 116. The semiconductor sub-epitaxial structures 110a, 110b are set in series with each other via the conductive connecting layer C. In the embodiment, the material of the first-type doped semiconductor layer 112 is, for example, p-GaN, and a material of the second-type doped semiconductor layer 116 is, for example, n-GaN. Furthermore, a doping concentration of the insulating base layer B is smaller than that of the second-type doped semiconductor layers 1161, 1162, and the insulating base layer B electrically isolates the semiconductor sub-epitaxial structures 110a, 110b when the micro light emitting diode chip 100i turns on. The first electrode 120 is electrically connected to the second-type doped semiconductor layer 1161 of the semiconductor sub-epitaxial structure 110a, and is located in the light-emitting region ER1. The second electrode 130 is electrically connected to the first-type doped semiconductor layer 1122 of the semiconductor sub-epitaxial structure 110b, and is located in the light-emitting region ER2.

To be more specific, the micro light emitting diode 100i further includes a first insulating layer 140, a second insulating layer 150 and a plurality of transparent conductive layers 160. The transparent conductive layers 160 are disposed and contact with the first-type doped semiconductor layers 1121, 1122. The first insulating layer 140 covers the semiconductor sub-epitaxial structures 110a, 110b and the transparent conductive layers 160. The first insulating layer 140 has a plurality of the holes H1~H4, for example, the hole H1 exposes a part of the second-type doped semiconductor layers 1161. The hole H2 exposes a part of the transparent conductive layer 160 on the semiconductor sub-epitaxial structures 110a. The hole H3 exposes a part of the second-type doped semiconductor layer 1162, and the hole H4 exposes a part of the transparent conductive layer 160 on the semiconductor sub-epitaxial structures 110b. The conductive connecting layer C is in contact with the transparent conductive layers 160 and the second-type doped semiconductor layers 1161, 1162 via the holes H1~H4, so as to make the light-emitting layers 1141, 1142 to be set in series. The second insulating layer 150 covers the conductive connecting layer C and the first insulating layer 140. The second insulating layer 150 has a plurality of holes H5, H6 to expose parts of the conductive connecting layer C. The first electrode 120 is in contact with the conductive connecting layer C which is located above the semiconductor sub-epitaxial structures 110a and is electrically connected to the second-type doped semiconductor layers 1161 via the hole H5. The second electrode 130 is in contact with the conductive connecting layer C which is located above the semiconductor sub-epitaxial structures 110b via the hole H6 and is electrically connected to the first-type doped semiconductor layers 1122 via the hole H6.

Figure 11A:
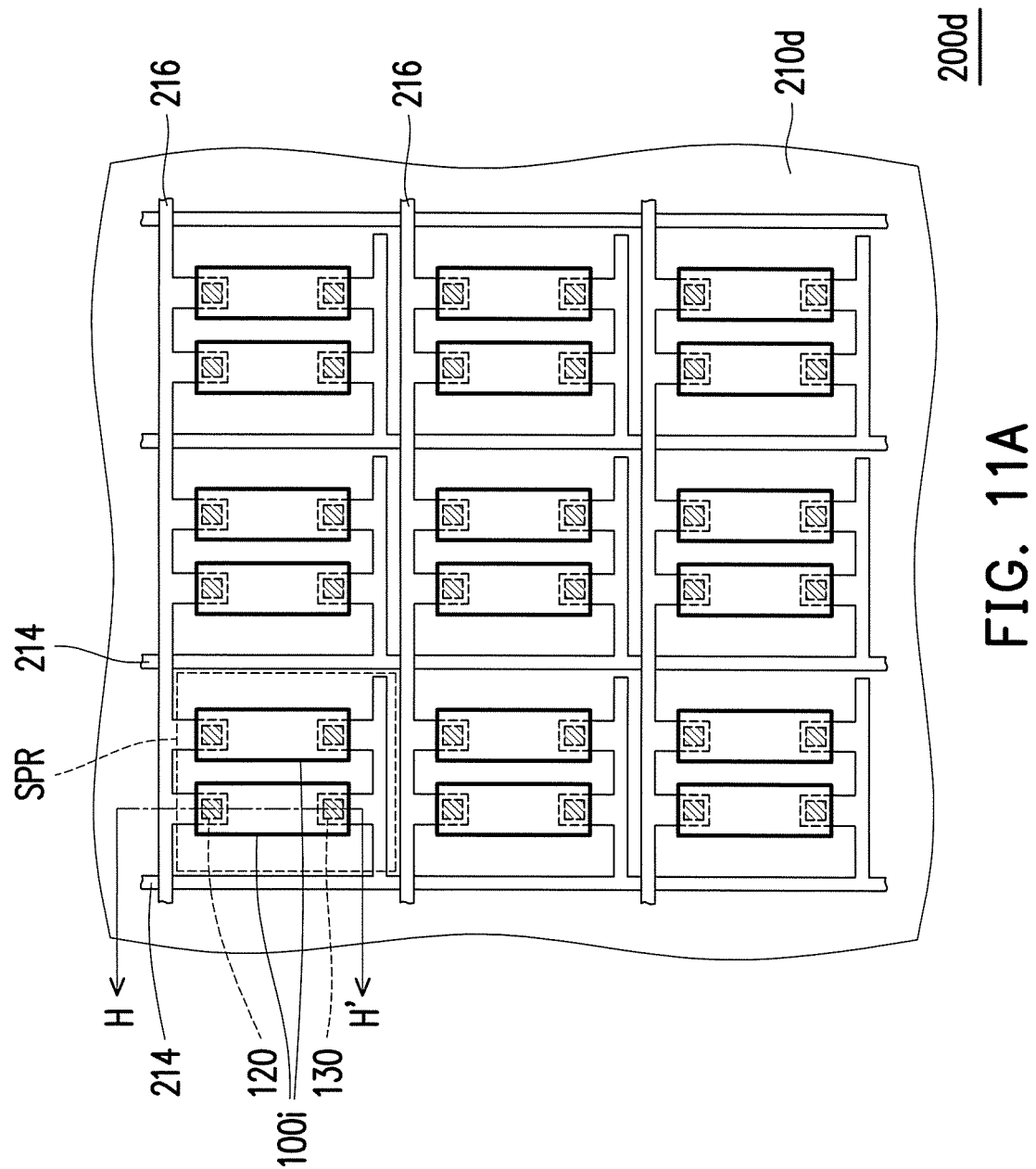
FIG. 11A is a top view of a display panel according to an embodiment of the invention.
Figure 11B:
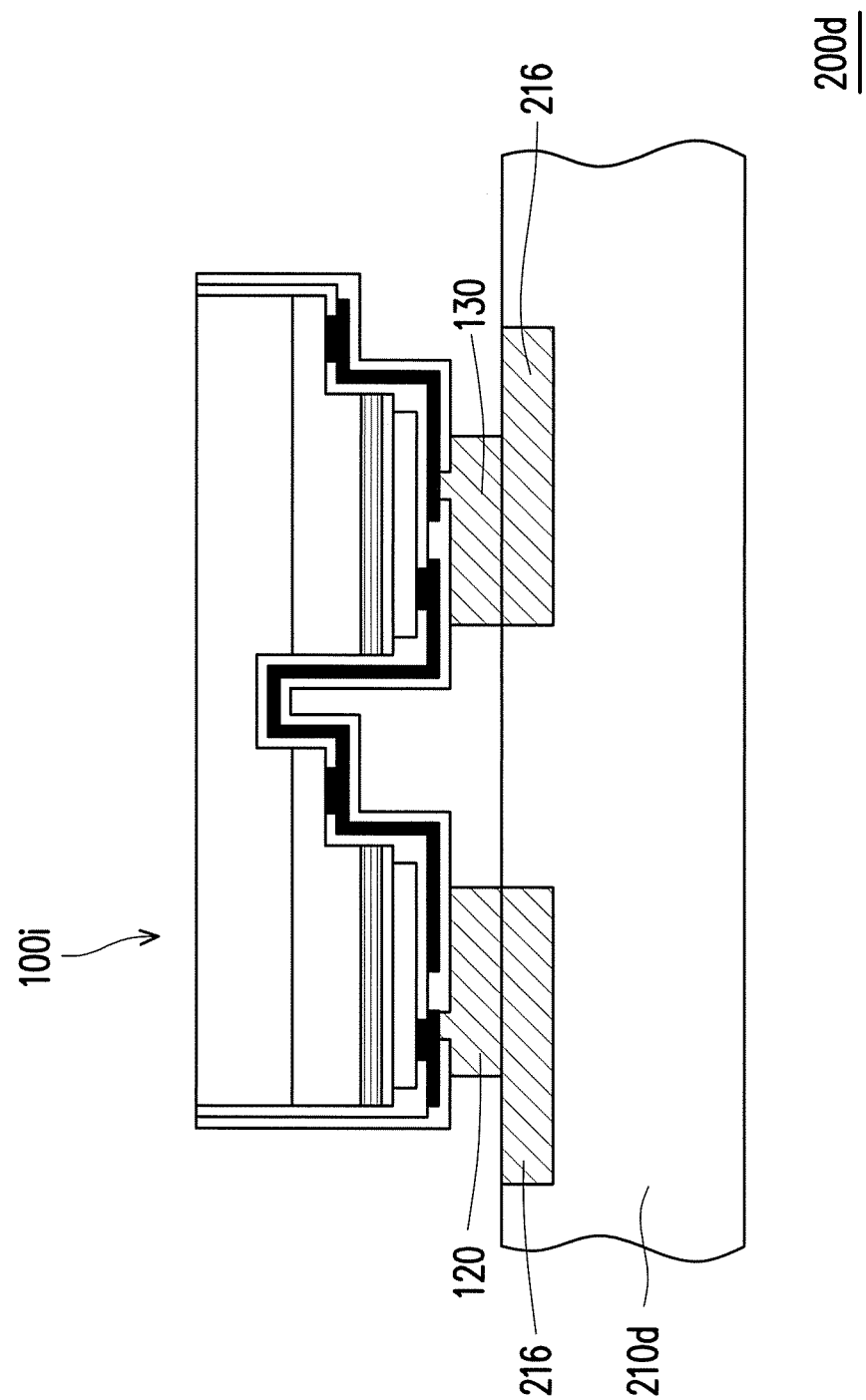
FIG. 11B is a schematic cross-sectional view of the display panel taken along a section line H-H' in FIG. 11A.
Figure 11C:
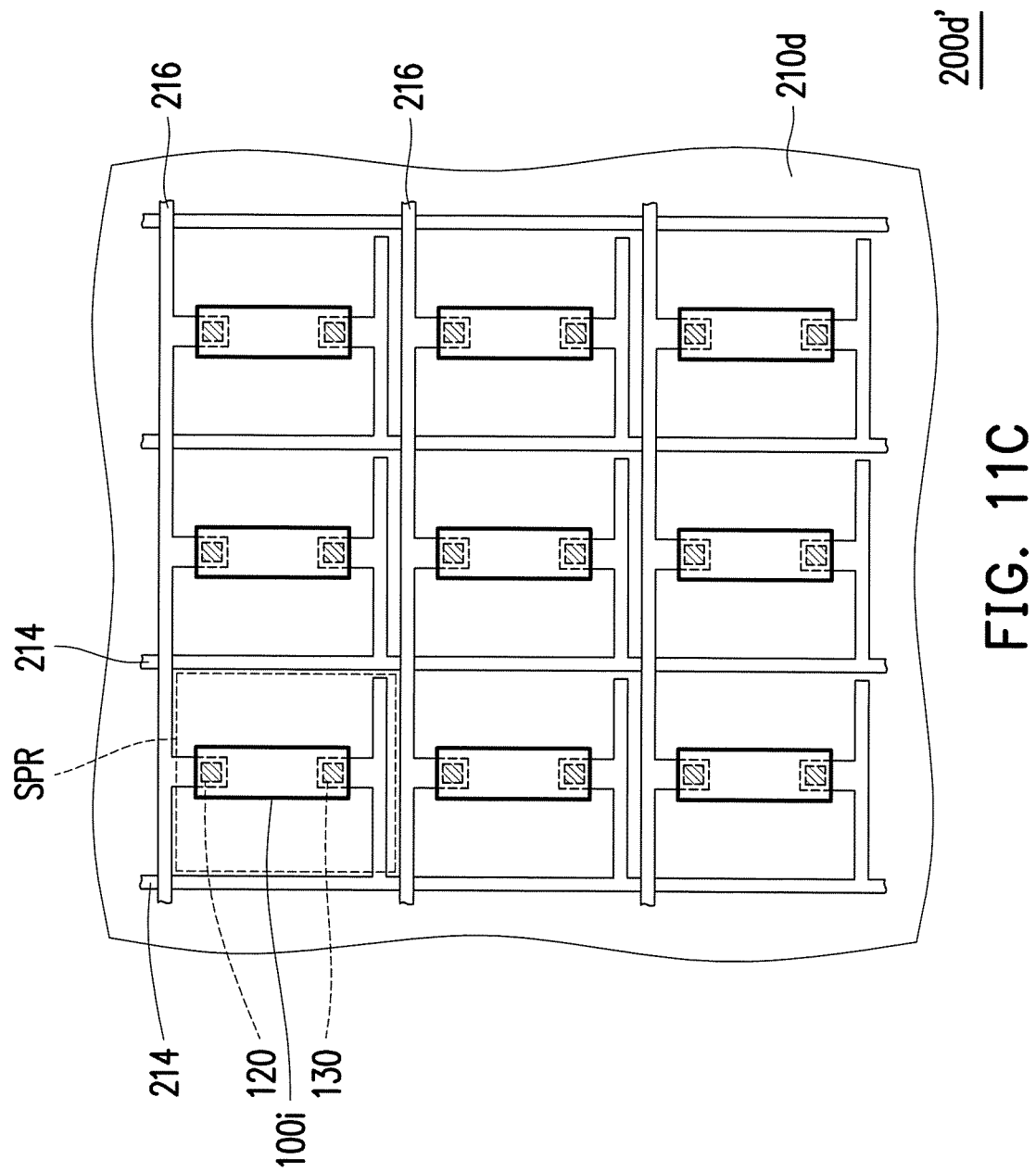
FIG. 11C is a top view of a display panel according to another embodiment of the invention.

FIG. 11A is a top view of a display panel according to an embodiment of the invention. FIG. 11B is a schematic cross-sectional view of the display panel taken along a section line H-H' in FIG. 11A. FIG. 11C is a top view of a display panel according to another embodiment of the invention.

Referring to FIG. 11A to FIG. 11B, in the embodiment, the display panel 200d includes a backplane 210d and a plurality of the micro light emitting diode chips 100i. The backplane 210d has a plurality of sub-pixel regions SPR, and is electrically connected to the micro light emitting diode chips 100i, and controls the micro light emitting diode chips 100i to emit light. To be more specific, the backplane 210d includes a plurality of third electrode lines 214 and a plurality of fourth electrode lines 216. The third electrode lines 214 and the fourth electrode lines 216 are arranged interlacedly. Two adjacent third electrode lines 214 and two adjacent fourth electrode lines 216 define one of the sub-pixel regions SPR. In the embodiment, two of the micro light emitting diode chips 100i are located in each of the sub-pixel regions SPR, and the two of the micro light emitting diode chips 100i are disposed in parallel in the sub-pixel region SPR.

Referring to FIG. 11C, the display panel 200d' of the embodiment is approximately similar to the display panel 200d in FIG. 11A and FIG. 11B, the main difference lies in that only one micro light emitting diode chip 100i is located in the subpixel-region SPR.

In the display panel 200d or 200d', since the light-emitting layers of the micro light emitting diode 100i are set in series, it can reduce the condition that the micro light emitting diode 100 can not emit light due to defect and enhance overall luminosity uniformity of the display panel 200d or 200d'. Next, since the micro light emitting diodes 100i are disposed in parallel in the sub-pixel region SPR, if one of the micro light emitting diodes 100i in the sub-pixel region SPR is open to be bonded on the backplane 210d, the other micro light emitting diode 100i in the sub-pixel region SPR might emit light. The numbers of defect pixel can be reduced. The corresponding electrode line which is connected to the defect micro light emitting diode can be cut off.

Based on the above, each of the micro light emitting diode chips of the embodiment in the invention has a plurality of second electrodes and a plurality of light-emitting layers corresponding to the second electrodes. In each of the sub-pixel regions in the display panel, the second electrodes of the micro light emitting diode chips are bonded to the pads on the backplane, as long as the first type carrier and the second type carrier provided by the backplane can still be recombined at least one of the light-emitting layers of the micro light emitting diode chip to emit light beam. In other words, the micro light emitting diode chips are transferred to the backplane, the micro light emitting diode chips of the embodiment in the invention take advantage of a larger electrode bonding area (such as the design of a plurality of second electrodes disposed at interval), and the higher bonding yield between the electrodes and the pads. Therefore, the micro light emitting diode chip of the embodiment in the invention can reduce the numbers of the defect pixels in the display panel using the micro light emitting diode chip, so that the process yield and the image quality of the display panel are improved. In addition, in the display panel of the embodiment in the invention, each the micro light emitting diode chip has a plurality of light-emitting regions which are able to be controlled independently.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A display panel, comprising:
   a backplane, having a plurality of sub-pixel regions and a plurality of pads; and
   a plurality of micro light emitting diode chips located in the sub-pixel regions, wherein each of the micro light emitting diode chips has a plurality of light-emitting regions and comprises:
   a semiconductor epitaxial structure, comprising a first-type doped semiconductor layer, a plurality of second-type doped semiconductor layers disposed at interval and a plurality of light-emitting layers disposed in the light-emitting regions at interval, wherein the light-emitting layers are located between the first-type doped semiconductor layer and the second-type doped semiconductor layers and electrically contact to the first-type doped semiconductor layer;
   a first electrode, electrically connected and in physical contact with the first-type doped semiconductor layer, and overlapped with the second-type doped semiconductor layers and the light-emitting layers; and
   a plurality of second electrodes, disposed at interval and electrically connected to the second-type doped semiconductor layers,
   wherein the micro light emitting diode chips are electrically connected to the backplane through the pads and the backplane controls the micro light emitting diode chips to emit light in the corresponding sub-pixel regions,
   wherein the light-emitting layers are independently controlled to emit light,
   wherein a type of carriers provided by the first electrode is a first type carrier and the other type of carriers provided by the second electrodes is a second type carrier, the first electrode and one of the second electrodes provide the first type carrier and the second type carrier to one of the light-emitting layers, and the first electrode and another one of the second electrodes provide the first type carrier and the second type carrier to another one of the light-emitting layers,
   wherein the first electrode is electrically connected to one of the pads of the backplane for providing the first type carrier, and at least one of the second electrodes is electrically connected to another one of the pads of the backplane for providing the second type carrier.

2. The display panel according to claim 1, wherein a range of a diagonal length of the micro light emitting diode chip falls in a range of 2 microns to 250 microns.

3. The micro light emitting diode chip according to claim 1, wherein the semiconductor epitaxial structure has at least one trench, the at least one trench separates the second-type doped semiconductor layers, and the light-emitting layers and exposes the first-type doped semiconductor layer, and the light-emitting layers are connected to the first-type doped semiconductor layer.

4. The display panel according to claim 3, wherein the first electrode and the second electrodes are located at the same side of the semiconductor epitaxial structure and the semiconductor epitaxial structure has a plurality of trenches, and the first electrode is electrically connected to the first-type doped semiconductor layer through one of the trenches.

5. The display panel according to claim 3, wherein the first electrode and the second electrodes of each of the micro light emitting diode chips are located at two opposite sides of the semiconductor epitaxial stricture, the second electrodes are located between the backplane and the semiconductor epitaxial structure, and the pads are electrically contacted to the second electrodes.

6. The display panel according to claim 5, wherein the number of the pads disposed in each of the sub-pixel regions is the same with the number of the second electrodes of each of the micro light emitting diode chips.

7. The display panel according to claim 3, wherein the first electrode and the second electrodes of each of the micro light emitting diode chips are located at two opposite sides of the semiconductor epitaxial structure respectively, and the first electrode is located between the backplane and the semiconductor epitaxial structure and is electrically contacted to one of the pads.

* * * * *